United States Patent
Yang et al.

(10) Patent No.: US 12,360,508 B2
(45) Date of Patent: Jul. 15, 2025

(54) CROSS-SCALE STRUCTURE FEATURE SURFACE MACHINING METHOD BASED ON MULTI-COMPONENT COLLABORATIVE VIBRATION

(71) Applicant: HARBIN INSTITUTE OF TECHNOLOGY, SHENZHEN, Shenzhen (CN)

(72) Inventors: Yang Yang, Shenzhen (CN); Jian Wen, Shenzhen (CN)

(73) Assignee: HARBIN INSTITUTE OF TECHNOLOGY, Shenzhen (CN)

( * ) Notice: Subject to any disclaimer, the term of this patent is extended or adjusted under 35 U.S.C. 154(b) by 509 days.

(21) Appl. No.: 17/974,765

(22) Filed: Oct. 27, 2022

(65) Prior Publication Data
US 2023/0251619 A1 Aug. 10, 2023

(30) Foreign Application Priority Data
Feb. 9, 2022 (CN) .......................... 202210121997.0

(51) Int. Cl.
*B23D 5/00* (2006.01)
*B23C 3/13* (2006.01)
(Continued)

(52) U.S. Cl.
CPC .............. *G05B 19/182* (2013.01); *B23C 3/13* (2013.01); *B23D 5/00* (2013.01); *B81C 1/00492* (2013.01);
(Continued)

(58) Field of Classification Search
CPC ............. Y10T 409/50–50984; B81C 1/00444; B81C 1/00492; B81C 1/005;
(Continued)

(56) References Cited

U.S. PATENT DOCUMENTS 6,776,563 B2 * 8/2004 Shamoto ................. B23B 29/12
409/292
6,925,915 B1 * 8/2005 Claesson ................ G05B 19/18
82/904

(Continued)

FOREIGN PATENT DOCUMENTS

CN     102078967 A  *  8/2012
CN     111320132 A     6/2020
(Continued)

OTHER PUBLICATIONS

Machine Translation of CN 111515412 A, which CN '412 was published Aug. 11, 2020.*

(Continued)

*Primary Examiner* — Erica E Cadugan

(57) ABSTRACT

The present disclosure relates to the technical field of cutting machining, and discloses a cross-scale structure feature surface machining method based on a multi-component collaborative vibration. A vibration in a z-axis direction is applied to a servo movement mechanism to realize the cutting of a micron-scale structure and the adjustment of the cutting depth; and the vibration in the z-axis direction is applied to a three-axis movement platform to realize the cutting of a millimeter-scale structure and the adjustment of the cutting depth. A required cross-scale structure feature surface can be machined and formed at one time through a collaborative vibration among a vibrating tool, a servo movement mechanism, and/or a three-axis movement platform according to the structure type contained in the required cross-scale structure, which can simplify a process flow and improve the machining efficiency, and has high economic efficiency.

14 Claims, 9 Drawing Sheets

(51) Int. Cl.
*B26D 7/08* (2006.01)
*B81C 1/00* (2006.01)
*G05B 19/18* (2006.01)
*B23D 79/00* (2006.01)

(52) U.S. Cl.
CPC .............. *B23D 79/00* (2013.01); *B26D 7/086* (2013.01); *G05B 2219/37355* (2013.01); *Y10S 83/956* (2013.01); *Y10T 409/500164* (2015.01); *Y10T 409/50082* (2015.01); *Y10T 409/502624* (2015.01); *Y10T 409/506232* (2015.01)

(58) Field of Classification Search
CPC ............... B81C 1/00515; Y10S 83/956; Y10S 82/904; B26D 7/086; B23B 29/125; B23B 37/00
USPC ........................ 409/288–348; 83/956; 82/904
See application file for complete search history.

(56) References Cited

U.S. PATENT DOCUMENTS 10,167,560 B2 * 1/2019 Guo .................. C23C 22/58
2017/0100781 A1 * 4/2017 Zhang ................ B23D 75/00

FOREIGN PATENT DOCUMENTS

| | | | |
|---|---|---|---|
| CN | 111515412 A | * | 8/2020 |
| CN | 111593382 A | | 8/2020 |
| DE | 10004062 A1 | * | 8/2000 |
| JP | 07-068401 A | * | 3/1995 |

OTHER PUBLICATIONS

Machine Translation of CN 102078967 A, which CN '967 was published Aug. 2012.*

* cited by examiner

CROSS-SCALE STRUCTURE FEATURE SURFACE MACHINING METHOD BASED ON MULTI-COMPONENT COLLABORATIVE VIBRATION

TECHNICAL FIELD

The present disclosure relates to the technical field of cutting machining, and in particular, to a cross-scale structure feature surface machining method based on a multi-component collaborative vibration.

BACKGROUND

The using performance and the interfacial effect of an engineering part can be changed by simultaneously using surface structures of different scales on a cross-scale structure feature surface, so as to achieve or enhance specific surface functions, such as the color effect, wettability, drag reduction, noise reduction, lubricity, and sealing property, of a structure of the engineering part. For example, high-performance parts such as an artificial compound eye, a diffractive element, a micro-channel chip, and a free-form optical lens with geometrical features such as a complex curved surface, a functional micro-nano structure surface layer, and ultra-high precision have been widely applied in high-end equipment and products due to their excellent performance, and have a very promising prospect.

For the machining of these high-performance parts with cross-scale structure feature surfaces, energy beam etching-based ultra-precision special machining processes such as electron beam etching, focused ion beam machining, and extreme ultraviolet lithography have high machining flexibility and high ability to machine nanometer-scale structures, but their application scopes are limited by their high cost and complicated process flow.

Chinese invention patent CN 111593382 A provides an electrochemical machining method for a submillimeter-micrometer-nanometer cross-scale three-dimensional patterned super-wetted surface. The method includes: depositing a micro-nano structure layer on a conductive substrate by an electrodeposition technology to obtain a super-hydrophilic surface with a micro-nano structure, and soaking with fluorosilane-ethanol solution or forming a low-surface energy molecular layer through chemical vapor deposition to obtain a super-hydrophobic surface; attaching an adhesive film by spin coating or self leveling; machining the adhesive film by a method for machining a hollow pattern by using lithography or nanosecond/femtosecond laser to obtain a mask; performing localized deposition to obtain a super-hydrophilic three-dimensional patterned surface with uniform wettability or a super-hydrophobic-super-hydrophilic three-dimensional patterned surface with non-uniform wettability; and then soaking with the fluorosilane-ethanol solution or forming a low-surface energy molecular layer through chemical vapor deposition to obtain a super-hydrophobic three-dimensional patterned surface with uniform wettability. By the method, the manufacturing of a submillimeter-micrometer-nanometer cross-scale three-dimensional patterned super-wetted surface is realized, and meanwhile, the pattern wettability controllability is also high. However, there are also the characteristics of complex process, difficulty in large-scale production, and high cost.

Compared with an energy beam machining process and an electrochemical machining method, a diamond tool-based ultra-precision machining process has the advantages of high economic benefits and mass machining, and it is one of the most promising ultra-precision machining processes.

Chinese invention patent CN 111320132 A provides a method and a device for preparing a multi-scale functional micro-structure on a high-hardness surface. The method of the patent includes: imprinting a micro-pit structure or ploughing a V-shaped trench micro-structure by using a single-point diamond tool first; and then imprinting a spiral micron or sub-micron-scale functional micro-structure on an inverted frustum cone-shaped micro-pit or the V-shaped trench micro-structure by using a multi-edge diamond tool. By the method, rapid machining of a micro-structure can be realized in an imprinting mode. However, the morphology of the micro-structure that can be formed by the method is limited by the shape and the dimension of the tool. Meanwhile, due to the characteristics of being limited by the dimension of the tool and a movement mechanism, the method cannot realize the machining of a nanometer-scale structure.

Therefore, it is of great significance to develop a millimeter-micrometer-nanometer cross-scale structure surface machining method which is simple in machining equipment, simple in process flow, high in efficiency, and suitable for industrial large-scale production is developed, which is of great significance.

SUMMARY

In order to overcome the shortcomings of the prior art, an objective of the present disclosure is to provide a cross-scale structure feature surface machining method based on a multi-component collaborative vibration, which can machine and form a cross-scale structure feature surface at one time, simplify a process flow, and improve the machining efficiency.

In order to solve the abovementioned problems, the technical solution adopted by the present disclosure is as follows: in a cross-scale structure feature surface machining method based on a multi-component collaborative vibration, a workpiece is machined by using a cutting process system. The cutting process system includes a base, a three-axis movement platform, a servo movement mechanism, and a vibrating tool. Both the three-axis movement platform and the vibrating tool are mounted on the base. The servo movement mechanism is mounted on the three-axis movement platform. The workpiece is mounted at an end-effector of the servo movement mechanism. A cross-scale structure includes at least two of a nanometer-scale structure, a micron-scale structure, and a millimeter-scale structure. During cutting machining, the workpiece is enabled to move in an x-axis by using the three-axis movement platform, and a required cross-scale structure is formed in a surface of the workpiece through a collaborative vibration among the vibrating tool, the servo movement mechanism, and/or the three-axis movement platform according to the structure type contained in the cross-scale structure.

When the cross-scale structure includes a nanometer-scale structure, an elliptic vibration is applied to the vibrating tool; a vibration plane of the elliptic vibration is located on an xoz plane; and the frequency $f_1$ of the elliptic vibration is less than 2000 Hz.

When the cross-scale structure includes a micron-scale structure, a vibration is applied to the servo movement mechanism; the vibration direction is in a z-axis direction; and the frequency $f_2$ of the vibration ranges from 10 Hz to 2000 Hz.

When the cross-scale structure includes a millimeter-scale structure, a vibration is applied to the three-axis movement platform; the vibration direction is in a z-axis direction; and the frequency $f_3$ of the vibration is not greater than 10 Hz.

According to the abovementioned cross-scale structure feature surface machining method based on a multi-component collaborative vibration, during cutting machining, after a first section of structure is formed on a surface of the workpiece, the workpiece is returned to an initial position, the vibrating tool is fed for a certain distance w in a y-axis direction, and a second section of structure is formed on the surface of the workpiece. A cycle of forming a section of structure is repeated discontinuously until the required cross-scale structure is formed on the surface of the workpiece.

According to the abovementioned cross-scale structure feature surface machining method based on a multi-component collaborative vibration, the feeding distance w of the vibrating tool in the y-axis direction satisfies:

$$\delta \geq \frac{w^2}{8r};$$

Where, $\delta$ is the required machining precision, and r is a cutting edge radius of the vibrating tool.

According to the abovementioned cross-scale structure feature surface machining method based on a multi-component collaborative vibration, when the elliptic vibration is applied to the vibrating tool, a position parameter equation of the vibrating tool satisfies:

$$\begin{cases} x = A \cos(2\pi f_1 t) \\ z = B_1 \cos(2\pi f_1 t + \varphi_1) \end{cases};$$

where A is the amplitude of the elliptic vibration in an x-axis direction; $B_1$ is the amplitude of the elliptic vibration in a z-axis direction; and $\varphi_1$ is a phase difference of the vibration displacement in the x-axis direction and the z-axis direction. During cutting machining, the movement trajectory of the vibrating tool relative to the workpiece satisfies:

$$x = A \cos(2\pi f_1 t) + vt;$$

$$z = B_1 \cos(2\pi f_1 t + \varphi_1);$$

the movement trajectory parameters (A, $B_1$, $\varphi_1$, v) satisfy:

$$v = d_1 * f_1;$$

$$d_1 \left( \frac{\gamma - \pi}{2\pi} \right) - A(\cos(\varphi_1 - \gamma) + \cos \varphi_1) = a;$$

$$\frac{2\pi f_1 A \sin \varphi_1 \sin \gamma}{v} + \gamma = 0;$$

$$h_1 = B_1(1 + \cos \gamma);$$

where v is a speed at which the three-axis movement platform enables the workpiece to move in the x-axis direction; $d_1$ is a spacing between nanometer-scale structures; $h_1$ is a height of the nanometer-scale structure; a is a horizontal distance between the highest point of the nanometer-scale structure and the closest lowest point thereof in a cutting direction; $\gamma$ satisfies:

$$\gamma = \pi f_1(t_1 - t_2);$$

where in an elliptic vibration cycle, $t_1$ is the time that the vibrating tool moves to a trajectory overlapping point from bottom to top; and $t_2$ is the time that the vibrating tool moves to the trajectory overlapping point from top to bottom.

According to the abovementioned cross-scale structure feature surface machining method based on a multi-component collaborative vibration, when a vibration is applied to a servo movement mechanism, the servo movement mechanism drives the workpiece to vibrate together, and a position equation during the vibration of the workpiece satisfies:

$$z = B_2 \cos(2\pi f_2 t + \varphi_2);$$

where $B_2$ is the amplitude of the workpiece in the z-axis direction; and $\varphi_2$ is a phase angle when a contour that needs to be machined is represented by a cosine function. During cutting machining, the movement trajectory of the vibrating tool relative to the workpiece satisfies:

$$x = vt;$$

$$z = B_2 \cos(2\pi f_2 t + \varphi_2);$$

the movement trajectory parameters ($B_2$, v, $f_2$) satisfy:

$$v = d_2 * f_2;$$

$$B_2 = \frac{h_2}{2};$$

where $d_2$ is a spacing between micron-scale structures; and $h_2$ is a height of the micron-scale structure.

According to the abovementioned cross-scale structure feature surface machining method based on a multi-component collaborative vibration, when a vibration is applied to a three-axis movement platform, the three-axis movement platform drives the workpiece to vibrate together, and a position equation during the vibration of the workpiece satisfies:

$$z = B_3 \cos(2\pi f_3 t + \varphi_3);$$

where $B_3$ is the amplitude of the workpiece in the z-axis direction; and $\varphi_3$ is a phase angle when a contour that needs to be machined is represented by a cosine function. During cutting machining, the movement trajectory of the vibrating tool relative to the workpiece satisfies:

$$x = vt;$$

$$z = B_3 \cos(2\pi f_3 t + \varphi_3);$$

the movement trajectory parameters ($B_3$, v, $f_3$) satisfy:

$$v = d_3 * f_3;$$

$$B_3 = \frac{h_3}{2};$$

where $d_3$ is a spacing between millimeter-scale structures; and $h_1$ is a height of the millimeter-scale structure.

According to the abovementioned cross-scale structure feature surface machining method based on a multi-component collaborative vibration, before cutting machining, for a required cross-scale structure feature surface (that is a given contour), the components of a spatial frequency spectrum of the required cross-scale structure feature surface are described through Fourier transform, and the movement trajectory parameters (A, $B_1$, $\varphi_1$, v), ($B_2$, v, $f_2$) and/or ($B_3$, v, $f_3$) of the cutting machining are obtained according to the obtained components of the spatial frequency spectrum, and then the workpiece is cut and machined.

According to the abovementioned cross-scale structure feature surface machining method based on a multi-component collaborative vibration, the components of the spatial frequency spectrum are obtained through the following steps:

S100, for a given cross-scale structure feature surface $z=f(x, y)$, taking M points on an x-axis, making M first straight lines perpendicular to the x-axis passing through the M points, taking N points in the y-axis direction, making N second straight lines perpendicular to the y-axis passing through the N points, extracting intersection points of the first straight lines and the second straight lines, so as to obtain N**M discrete points, points $Z_{i,j}=f(x_j, y_j)$, $1 \leq i \leq M$, $1 \leq j \leq N$, and obtain a discrete point data matrix $[Z]_{N*M}$;

S200, performing Fourier transform on the discrete point data matrix $[Z]_{N*M}$, so as to obtain a frequency spectrum matrix $[K]_{N*M}$ and a corresponding spectrogram, where the frequency spectrum matrix $[K]_{N*M}$ and the corresponding spectrogram include the frequency spectrum information of a plurality of groups of component plane waves in different directions that form a curved surface, and the frequency spectrum information includes the amplitude value, frequency, phase angle, and direction of each group of plane waves;

S300, comparing the amplitude value square sums of the frequency spectrum groups in each direction according to the frequency spectrum matrix and the corresponding frequency spectrum information, taking the direction pointed by the frequency spectrum group with the maximum amplitude value square sum as a machining direction x, and the direction perpendicular to the machining direction x as a feeding direction y;

S400, selecting a y-directional feeding spacing w according to the required machining precision, and dividing the cross-scale structure feature surface according to the spacing w in the direction y to divide the cross-scale structure feature surface into L units, performing frequency spectrum analysis on each unit, and extracting the frequency spectrum information of each unit in x-axis direction to obtain the components of the spatial frequency spectrum of the cross-scale structure feature surface (spatial frequency spectrum 1-spatial frequency spectrum L), where the frequency spectrum parameters of each group of spatial frequency spectrum include a spatial frequency, an amplitude value, a phase angle, and a direction; and calculating to obtain a height, a cycle, and a distance of each cosine contour forming the given cross-scale structure feature surface by using the frequency spectrum parameters.

According to the abovementioned cross-scale structure feature surface machining method based on a multi-component collaborative vibration, when the cross-scale structure includes a nanometer-scale structure, the movement trajectory parameters of the cutting machining are obtained by the following steps:

S510, selecting the frequency $f_1$ of an elliptic vibration, and determining the movement trajectory parameters $(A, B_1, \varphi_1, v)$ according to $d_1$, $h_1$ and a determined in S400;

S520, determining the movement trajectory parameters $(B_2, v, f_2)$ according to v determined in S510 and the spacing $d_2$ and the height $h_2$ of the micron-scale structure, where when a cross-scale structure does not include a micron-scale structure, $f_2=0$, $B_2=0$;

S530, determining the movement trajectory parameters $(B_3, v, f_3)$ according to v determined in S510 and the spacing $d_3$ and the height $h_3$ of the millimeter-scale structure, where when a cross-scale structure does not include a micron-scale structure, $f_3=0$, $B_3=0$;

and when the cross-scale structure includes a micron-scale structure and millimeter-scale structure, the movement trajectory parameters of the cutting machining are obtained by the following steps:

S610, selecting the vibration frequency $f_2$ of a servo movement mechanism, and determining the movement trajectory parameters $(B_2, v, f_2)$ according to the spacing $d_2$ and the height $h_2$ of the micron-scale structure;

S620, determining the movement trajectory parameters $(B_3, v, f_3)$ according to v determined in S610 and the spacing $d_3$ and the height $h_3$ of the millimeter-scale structure.

According to the cross-scale structure feature surface machining method based on a multi-component collaborative vibration, the components of each group of spatial frequency spectrum correspond to each group of process parameters S; each group of process parameters S includes a group of movement trajectory parameters $(A, B_1, \varphi_1, v)$, $(B_2, v, f_2)$, and/or $(B_3, v, f_3)$; and the spatial frequency spectrum 1-spatial frequency spectrum L corresponds to process parameters $S_1, S_2, S_3, \ldots, S_l$.

The abovementioned cross-scale structure feature surface machining method based on a multi-component collaborative vibration, during cutting and machining the surface of the workpiece, includes the following steps:

S710, inputting the process parameters $S_1, S_2, S_3 \ldots S_l$ and the y-directional feeding spacing w into the cutting process system;

S720, enabling the cutting process system to perform collaborative movement according to process parameter $S_1$ and to return the workpiece to an initial position after forming a first section of structure on the surface of the workpiece;

S730, feeding the vibrating tool for a certain distance w in the y-axis direction;

S730, enabling the cutting process system to perform the collaborative movement according to the process parameter $S_2$ and to return the workpiece to an initial position after forming a second section of structure on the surface of the workpiece;

S740, feeding the vibrating tool for a certain distance w in the y-axis direction;

. . .

The vibrating tool is fed for a certain distance w in the y-axis direction after a section of structure is formed on the surface of the workpiece by performing the collaborative vibration according to a group of process parameter S each time, until the required cross-scale structure is formed according to L groups of process parameters.

According the abovementioned cross-scale structure feature surface machining method based on a multi-component collaborative vibration, after the process parameters $S_1, S_2, S_3 \ldots S_l$ are obtained, the quality of a blank of the workpiece is analyzed, and the workpiece is precut as required.

According to the abovementioned cross-scale structure feature surface machining method based on a multi-component collaborative vibration, the vibrating tool is a diamond tool, and the cutting edge radius of the vibrating tool ranges from 50 nm to 200 nm.

Compared with the prior art, the present disclosure has the beneficial effects that: by the method, an elliptic vibration is applied to a vibrating tool to realize the cutting of a nanometer-scale structure and the adjustment of a cutting depth; a vibration in a z-axis direction is applied to a servo movement mechanism to realize the cutting of a micron-scale structure and the adjustment of the cutting depth; and a vibration in the z-axis direction is applied to a three-axis movement platform to realize the cutting of a millimeter-scale structure and the adjustment of the cutting depth. A required cross-scale structure feature surface can be machined and formed at one time through a collaborative vibration among the vibrating tool, the servo movement mechanism, and/or the three-axis movement platform according to the structure type contained in the required cross-scale structure. Compared with an energy beam machining process and an electrochemical machining method, the method can simplify a process flow, and improve the machining efficiency. Compared with a machining method of imprinting, the method is not limited by the shape of a tool, and has the advantage of multi-frequency multi-scale adjustment of the cutting depth.

The present disclosure will be further described in detail below with reference to the accompanying drawing and specific implementation modes.

BRIEF DESCRIPTION OF THE DRAWINGS

Curves in FIG. 9, FIG. 10, FIG. 13, and FIG. 4 are contours of cross sections of corresponding parts.

DETAILED DESCRIPTION OF THE EMBODIMENTS

Figure 1:
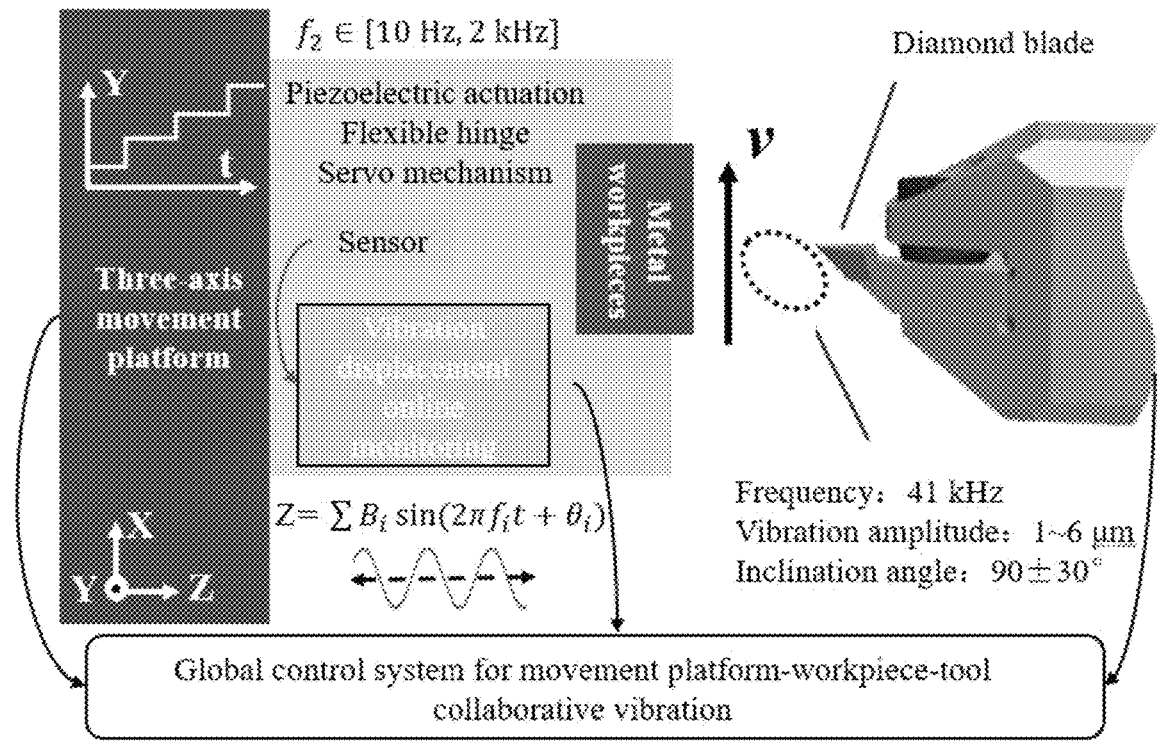
FIG. 1 is a schematic diagram of a cutting process system of an embodiment of the present disclosure.
Figure 2:
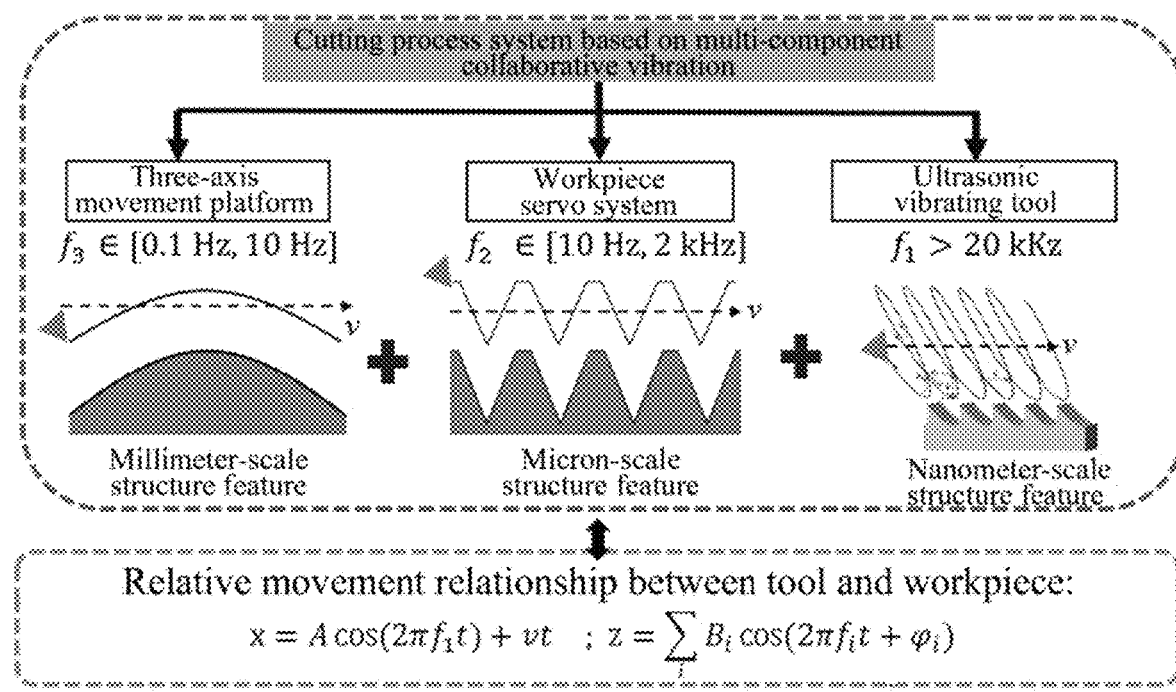
FIG. 2 is a collaborative vibration relationship diagram of an embodiment of the present disclosure.

The embodiments of the present disclosure are described in detail below. The embodiments of the present disclosure provide a cross-scale structure feature surface machining method based on a multi-component collaborative vibration. A workpiece is machined by using a cutting process system. As shown in FIG. 1 and FIG. 2, the cutting process system includes a base, a three-axis movement platform, a servo movement mechanism, and a vibrating tool. Both the three-axis movement platform and the vibrating tool are mounted on the base. The servo movement mechanism is mounted on the three-axis movement platform. The workpiece is mounted at an end-effector of the servo movement mechanism. A cross-scale structure includes at least two of a nanometer-scale structure, a micron-scale structure, and a millimeter-scale structure. During cutting machining, the workpiece is enabled to move in an x-axis by using the three-axis movement platform, and a required cross-scale structure is formed on a surface of the workpiece through a collaborative vibration among the vibrating tool, the servo movement mechanism, and/or the three-axis movement platform according to the structure type contained in the cross-scale structure.

When the cross-scale structure includes a nanometer-scale structure, an elliptic vibration is applied to the vibrating tool. A vibration plane of the elliptic vibration is located on an xoz plane. The frequency $f_1$ of the elliptic vibration is less than 2000 Hz.

When the cross-scale structure includes a micron-scale structure, a vibration is applied to the servo movement mechanism, the vibration direction is in a z-axis direction, and the frequency $f_2$ of the vibration ranges from 10 Hz to 2000 Hz.

When the cross-scale structure includes a millimeter-scale structure, a vibration is applied to the three-axis movement platform, the vibration direction is in a z-axis direction, and the frequency of the vibration is not greater than 10 Hz.

By the method, an elliptic vibration can be applied to a vibrating tool to realize the cutting of a nanometer-scale structure and the adjustment of a cutting depth; a vibration in a z-axis direction can be applied to a servo movement mechanism to realize the cutting of a micron-scale structure and the adjustment of the cutting depth; and a vibration in the z-axis direction can be applied to a three-axis movement platform to realize the cutting of a millimeter-scale structure and the adjustment of the cutting depth. A required cross-scale structure feature surface can be machined and formed at one time through a collaborative vibration among the vibrating tool, the servo movement mechanism, and/or the three-axis movement platform according to the structure type contained in the required cross-scale structure. Compared with an energy beam machining process and an electrochemical machining method, the method can simplify a process flow and improve the machining efficiency, and has high economic efficiency. Compared with a machining method of imprinting, the method is not limited by the shape of a tool, and has the advantage of multi-frequency multi-scale adjustment of cutting depth.

In the present embodiment, the nanometer-scale structure refers to that the morphological features and dimensional precision of micro structures on the surface of a workpiece are nanometer-scale (below 1 μm), the micron-scale structure refers to that the morphological features and dimensional precision of micro structures on the surface of the workpiece are micron-scale (1 μm to 100 μm), and the millimeter-scale structure refers to that the morphological features and dimensional precision of micro structures on the surface of the workpiece are millimeter scale (above 0.1 mm).

In the present embodiment, "through a collaborative vibration among the vibrating tool, the servo movement mechanism, and/or the three-axis movement platform according to the structure type contained in the cross-scale structure" refers to that when the cross-scale structure includes the nanometer-scale structure, the micron-scale structure, and the millimeter-scale structure, the vibrating tool, the servo movement mechanism, and the three-axis movement platform perform the collaborative vibration together. When the cross-scale structure includes a nanometer-scale structure and a micron-scale structure, the vibrating tool and the servo movement mechanism perform the collaborative vibration together, while the three-axis movement platform does not vibrate. When the cross-scale structure includes a nanometer-scale structure and a millimeter-scale structure, the vibrating tool and the three-axis movement platform perform the collaborative vibration together, while the servo movement mechanism does not vibrate. When the cross-scale structure includes a micron-scale structure and a millimeter-scale structure, the servo movement mechanism and the three-axis movement platform perform the collaborative vibration together, while the three-axis movement platform does not vibrate.

Further, during cutting machining, the workpiece is enabled to move in an x-axis direction by using the three-axis movement platform perform, and meanwhile, a first section of structure is formed on a surface of the workpiece by the vibrating tool through the collaborative vibration among the vibrating tool, the servo movement mechanism, and/or the three-axis movement platform according to the structure type contained in the cross-scale structure. After that, the workpiece is returned to an initial position, and the vibrating tool is fed for a certain distance w in a y-axis direction. Then, a second section of structure is formed on the surface of the workpiece in the same machining mode. A cycle of forming a section of structure is repeated discontinuously to form a third section of structure, a fourth section of structure, . . . , on the surface of the workpiece until the required cross-scale structure is formed on the surface of the workpiece.

Figure 3:
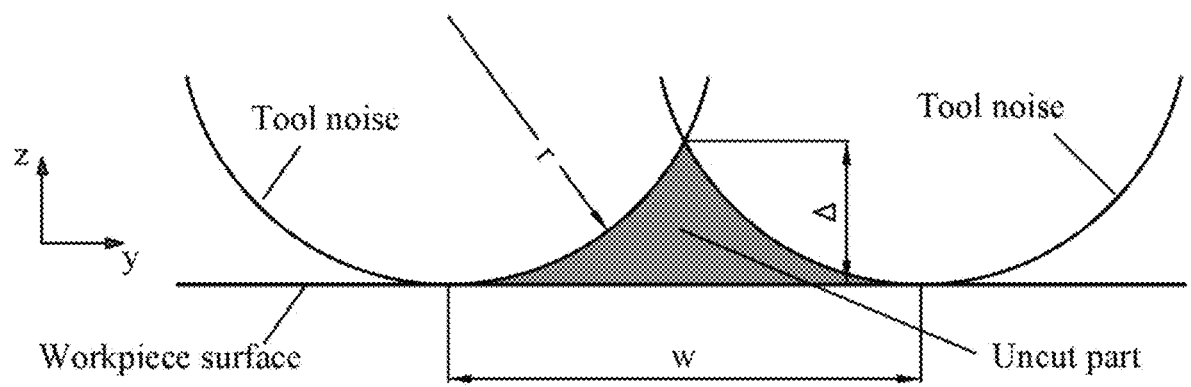
FIG. 3 is a relationship diagram of w and A in an embodiment of the present disclosure.

Further, as shown in FIG. 3, when the vibrating tool is fed for cutting in the y-axis direction, there is an uncut part remains between every two adjacent cuttings. The height of the uncut part is $\Delta$, and $$\Delta = \frac{w^2}{8r}.$$

During cutting machining, the feeding distance w of the vibrating tool in the y-axis direction satisfies:

$$\delta \geq \Delta = \frac{w^2}{8r};$$

where $\delta$ is the required precision, and r is a cutting edge radius of the vibrating tool. Therefore, during cutting machining, the feeding distance w of the vibrating tool in the y-axis direction may be determined according to the required machining precision $\delta$, and the cutting edge radius r of the vibrating tool.

Figure 4:
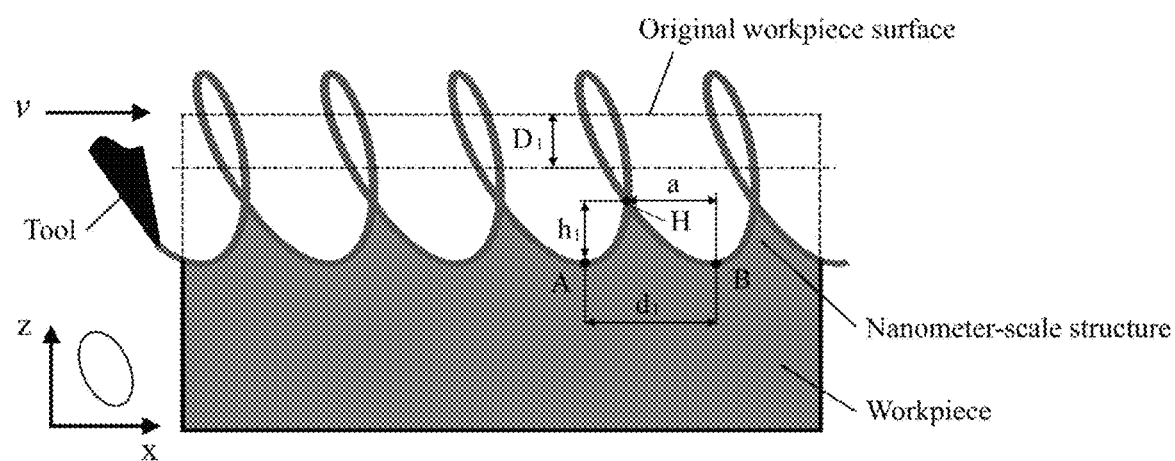
FIG. 4 is schematic diagram of a nanometer-scale structure of an embodiment of the present disclosure.

Specifically, as shown in FIG. 4, when the nanometer-scale structure is formed on the surface of the workpiece, v is a speed at which the three-axis movement platform enables the workpiece to move in the x-axis direction; $D_1$ (the distance from a trajectory center line of the vibrating tool to a surface of an initial workpiece) is a nominal cutting depth; point A and point B are two adjacent lowest points of the nanometer-scale structure; $d_1$ is the spacing between nanometer-scale structures (the distance between the point A and the point B); H is the highest point of the nanometer-scale structure between the point A and the point B; $h_1$ is a height of the nanometer-scale structure; a is a horizontal distance between the highest point H of the nanometer-scale structure and the closest lowest point B thereof in a cutting direction (on the right of point H); the x-axis direction is a cutting direction; and the z-axis direction is a cutting depth direction.

When an elliptic vibration is applied to the vibrating tool, a position parameter equation of the vibrating tool satisfies:

$$\begin{cases} x = A \cos(2\pi f_1 t) \\ z = B_1 \cos(2\pi f_1 t + \varphi_1) \end{cases};$$

where A is the amplitude of the elliptic vibration in the x-axis direction; $B_1$ is the amplitude of the elliptic vibration in the z-axis direction; and $\varphi_1$ is a phase difference between vibration displacement in the x-axis direction and the z-axis direction. During machining, the movement of the vibrating tool relative to the workpiece is formed by superposing the elliptic vibration and the movement in the x-axis direction provided for the workpiece by the three-axis movement platform. During cutting machining, the movement trajectory of the vibrating tool relative to the workpiece satisfies:

$x = A \cos \cos(2\pi f_1 t) + vt;$ $z = B_1 \cos \cos(2\pi f_1 t + \varphi_1);$ in FIG. 4, the cycle of the elliptic vibration that the vibrating tool goes through from point A to point B is $1/f_1$, the displacement produced by the elliptic vibration is 0, and it can be obtained that the distance between point A and point B, that is, the spacing $d_1$ between the nanometer-scale structures, satisfies:

$$d_1 = v/f_1 \tag{1}$$

Therefore, when the spacing $d_1$ of the nanometer-scale structure that needs to be machined is known, v and $f_1$ can be selected according to an actual machining condition.

As shown in FIG. 4, point H is a trajectory overlapping point in an elliptic vibration cycle. Assuming that the time that the tool passes through the point H from bottom to top is $t_1$, and the time that the tool passes through the point H from top to bottom is $t_2$, the following equation can be obtained by the abscissa of the point H:

$x_H = A \cos \cos(2\pi f_1 t_1) + vt_1 = A \cos \cos(2\pi f_1 t_2) + vt_2$ it is obtained that:

$A[\cos(2\pi f_1 t_1) - \cos(2\pi f_1 t_2)] + v(t_1 - t_2) = 0$ it is then obtained by a trigonometric formula that:

$$A[-2 \sin(\pi f_1(t_1+t_2))\sin(\pi f_1(t_1-t_2))]+v(t_1-t_2)=0 \tag{2}$$

Since a movement component of the tool in a z-axis direction is cosine movement, and the longitudinal coordinates of time $t_1$ and time $t_2$ are equal, it is obtained that:

$$\frac{(2\pi f_1 t_1 + \varphi_1 + 2\pi f_1 t_2 + \varphi_1)}{2} = 2k\pi \quad k \text{ is an integer}$$

it is obtained that:

$$\pi f_1(t_1+t_2)=2k\pi-\varphi_1 \tag{3}$$

By substituting formula (3) into formula (2), it can be obtained that:

$$2A \sin \sin \varphi_1 \sin \sin(\pi f_1(t_1-t_2))+v(t_1-t_2)=0 \tag{4}$$

an intermediate variable r is introduced:

$$\gamma=\pi f_1(t_1-t_2) \tag{5}$$

By substituting the intermediate variable r into equation (4), and multiplying both sides by $\pi f_1/v$, it can be obtained that:

$$\frac{2\pi f_1 A \sin\sin\varphi_1 \sin\sin\gamma}{v} + \gamma = 0 \quad (6)$$

Therefore, $\gamma$ may be solved through the abovementioned equation (6).

By simultaneously solving equations (3) and (5), it can be obtained that:

$$t_1 = \frac{2k\pi - \varphi_1 + \gamma}{2\pi f_1} \quad (7)$$

By substituting $t_1$, the longitudinal coordinates of point H can be obtained as:

$$z_H = B_1 \cos\cos(2f_1 t_1 + \varphi_1) = B_1 \cos\cos\gamma$$

The height h1 of the nanometer-scale structure may be obtained that:

$$h_1 = z_H - (-B_1) = B_1(1 + \cos\gamma) \quad (8)$$

Setting that the tool passes through point B at time ( ), then there is:

$$2\pi f_1 t_3 + \varphi_1 = (2k+1)\pi$$

it is obtained that:

$$t_3 = \frac{(2k+1)\pi - \varphi_1}{2\pi f_1} \quad (9)$$

a is the difference between the abscissas of point B and point H, $$a = x_B - x_H = A\cos(2\pi f_1 t_3) + v t_3 - A\cos(2\pi f_1 t_1) - v t_1 \quad (10)$$

Equations (7) and (9) are substituted into equation (10) to obtain:

$$d_1\left(\frac{\gamma - \pi}{2\pi}\right) - A(\cos(\varphi_1 - \gamma) + \cos\varphi_1) = a \quad (11)$$

Therefore, when the nanometer-scale structure is cut and machined, the movement trajectory parameters (A, $B_1$, $\varphi_1$, v) satisfy:

$$v = d_1 * f_1;$$

$$d_1\left(\frac{\gamma - \pi}{2\pi}\right) - A(\cos\cos(\varphi_1 - \gamma) + \cos\cos\varphi_1) = a;$$

$$\frac{2\pi f_1 A \sin\sin\varphi_1 \sin\sin\gamma}{v} + \gamma = 0;$$

$$h_1 = B_1(1 + \cos\cos\gamma).$$

In the present embodiment, $f_1$=41 kHz, the speed v at which the three-axis movement platform enables the workpiece to move in an x-axis direction can be obtained according to the spacing $d_1$ between the required nanometer-scale structures. A, $B_1$, $\varphi_1$ are associated with the height $h_1$, the distance A, the spacing $d_1$, and the cutting speed v. The movement trajectory parameters A, $B_1$, $\varphi_1$, v can be obtained according to the abovementioned calculation formulas on the basis of the feature parameters of the required nanometer-scale structure and the cutting speed v.

Figure 5:
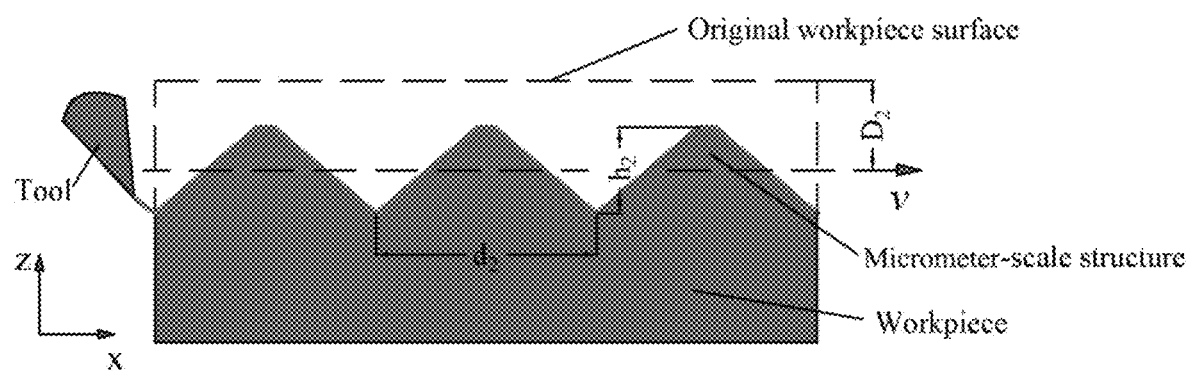
FIG. 5 is a schematic diagram of a micron-scale structure of an embodiment of the present disclosure.
Figure 6:
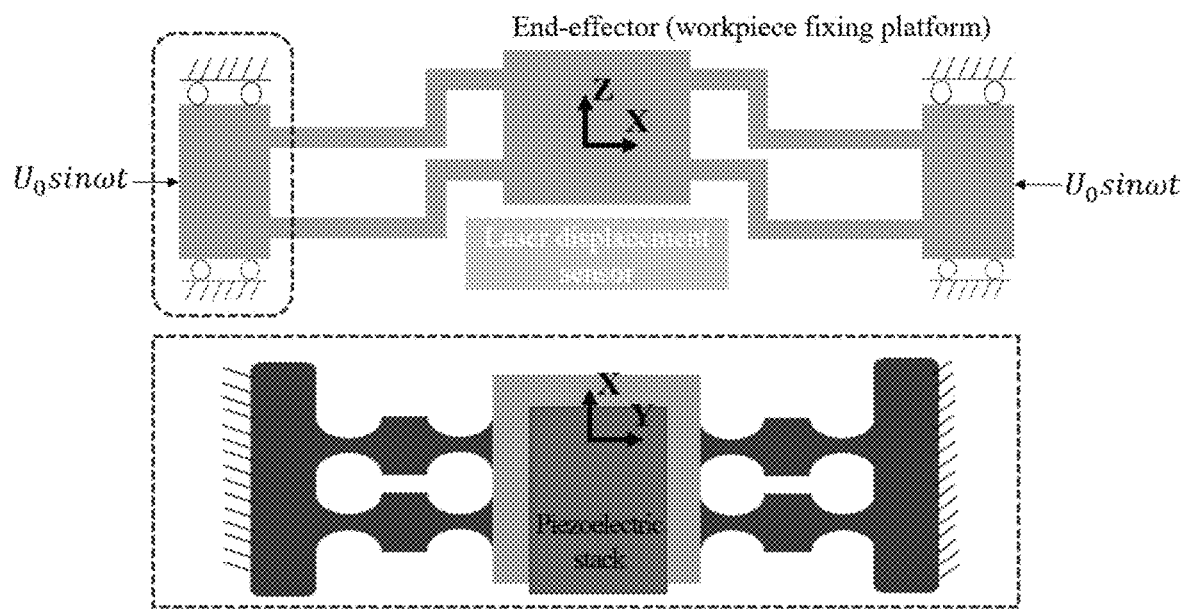
FIG. 6 is a schematic diagram of a servo movement mechanism of the embodiment of the present disclosure.

Specifically, as shown in FIG. 5, when a micron-scale structure is formed on the surface of the workpiece, v is a speed at which the three-axis movement platform enables the workpiece to move in the x-axis direction; $D_2$ (the distance from a trajectory center line of the vibrating tool to a surface of an initial workpiece) is a nominal cutting depth; $d_2$ is a spacing between micron-scale structures; $h_2$ is a height of the micron-scale structure; the x-axis direction is a cutting direction; and the z-axis direction is a cutting depth direction. When a micron-scale structure is machined on the surface of the workpiece, a vibration is applied to a servo movement mechanism, the servo movement mechanism drives the workpiece to vibrate together, and a position equation during the vibration of the workpiece satisfies:

$$z = B_2 \cos\cos(2\pi f_2 t + \varphi_2);$$

where $B_2$ is the amplitude of the workpiece in the z-axis direction, $\varphi_2$ is a phase angle when a contour that needs to be machined is represented by a cosine function; during cutting machining, the movement trajectory of the vibrating tool relative to the workpiece satisfies:

$$x = vt;$$

$$z = B_2 \cos\cos(2\pi f_2 t + \varphi_2);$$

the movement trajectory parameters ($B_2$, v, $f_2$) satisfy:

$$v = d_2 * f_2;$$

$$B_2 = \frac{h_2}{2};$$

therefore, suitable v and $f_2$ can be selected according to machining requirements, and the value of $B_2$ can be obtained according to the height of the micron-scale structure that needs to be machined, so as to obtain movement trajectory parameters ($B_2$, v, $f_2$). Specifically, as shown in FIG. 6, the servo movement mechanism includes a straight circular flexure hinge and an end-effector (workpiece fixing platform) mounted on the straight circular flexure hinge. By means of piezoelectric actuation, z-directional vibrations are applied to both ends of the straight circular flexure hinge, and the displacement of the workpiece in the z-axis direction is monitored online by a laser displacement sensor. Specifically, the servo movement mechanism may adjust the frequency, amplitude, etc. of an input voltage of the piezoelectric actuation through LabVIEW, so as to realize the adjustment of the frequency and the amplitude of the servo movement mechanism.

Figure 7:
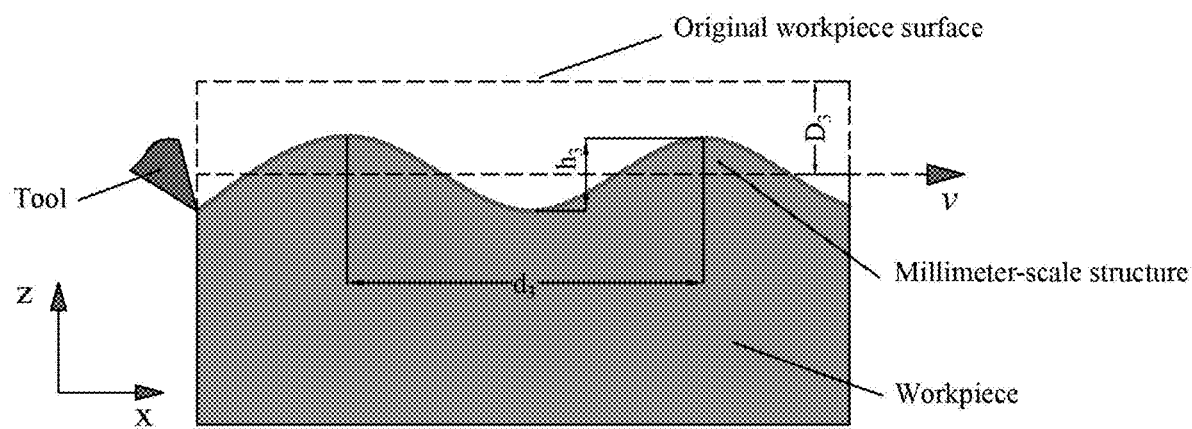
FIG. 7 is schematic diagram of a millimeter-scale structure of an embodiment of the present disclosure.

Specifically, as shown in FIG. 7, when a millimeter-scale structure is formed on the surface of the workpiece, v is a speed at which the three-axis movement platform enables the workpiece to move in the x-axis direction; $D_3$ (the distance from a trajectory center line of the vibrating tool to a surface of an initial workpiece) is a nominal cutting depth; $d_3$ is the spacing between millimeter-scale structures; $h_3$ is a height of the millimeter-scale structure; the x-axis direction is a cutting direction; and the z-axis direction is a cutting depth direction. During cutting machining, a vibration is applied to a three-axis movement platform, the three-axis movement platform drives the workpiece to vibrate together, and a position equation during the vibration of the workpiece satisfies:

$$z = B_3 \cos\cos(2\pi f_3 t + \varphi_3);$$

where $B_3$ is the amplitude of the workpiece in the z-axis direction, $\varphi_3$ is a phase angle when a contour that needs to be machined is represented by a cosine function; during cutting machining, the movement trajectory of the vibrating tool relative to the workpiece satisfies:

$$x = vt;$$

$$z = B_3 \cos\cos(2\pi f_3 t + \varphi_3);$$

the movement trajectory parameters ($B_3$, v, $f_3$) satisfy:

$$v = d_3 * f_3;$$

$$B_3 = \frac{h_3}{2};$$

therefore, suitable v and $f_3$ can be selected according to machining requirements, and the value of $B_3$ can be obtained according to the height of the micron-scale structure that needs to be machined, so as to obtain the movement trajectory parameters ($B_3$, v, $f_3$). Specifically, the three-axis movement platform (Aerotech ANT130-060-XYZ) may be programmed through control software A3200 Motion Composer thereof, so as to control the movement of the x-axis, y-axis, and the z-axis. In the present embodiment, the three-axis movement platform, the servo movement mechanism, and the vibrating tool are independent control units. During cutting machining, the machining of the cross-scale structure feature surface can be realized through a collaborative vibration.

Specifically, before cutting machining, for a required cross-scale structure feature surface, the components of a spatial frequency spectrum of the required cross-scale structure feature surface can be described through Fourier transform, and the movement trajectory parameters (A, $B_1$, $\varphi_1$, v), ($B_2$, v, $f_2$), and/or ($B_3$, v, $f_3$) of the cutting machining can be obtained according to the obtained components of the spatial frequency spectrum, and then the workpiece is cut and machined.

Specifically, the components of the spatial frequency spectrum are obtained through the following steps.

S100, for a given cross-scale structure feature surface z=f(x, y), M points are taken from an x-axis, M first straight lines perpendicular to the x-axis passing through the M points are made, N points are taken in the y-axis direction, N second straight lines perpendicular to the y-axis passing through the N points are made, intersection points of the first straight lines and the second straight lines are extracted, so as to obtain M*N discrete points, points $Z_{i,j}=f(x_j, y_j)$, $1 \leq i \leq M$, $1 \leq j \leq N$, and obtain a discrete point data matrix $[Z]_{N*M}$.

S200, Fourier transform (by using software such as Matlab) is performed on the discrete point data matrix $[Z]_{N*M}$, so as to obtain a frequency spectrum matrix $[K]_{N*M}$ and a corresponding spectrogram, where the frequency spectrum matrix $[K]_{N*M}$ and the corresponding spectrogram include the frequency spectrum information of a plurality of groups of component plane waves in different directions that form a curved surface z=f(x, y); the frequency spectrum information includes the amplitude value, frequency, phase angle, and direction of each group of plane waves; and a theoretical formula of two-dimensional discrete Fourier transform is:

$$F(u, v) = \sum_{x=0}^{M-1} \sum_{y=0}^{N-1} f(x, y) e^{-j2\pi\left(\frac{ux}{M} + \frac{vy}{N}\right)};$$

M and N are respectively a length and a width of a spectrogram image, U and x range from 1 to M−1, and v and y range from 1 to M−1.

S300, the amplitude value square sums of the frequency spectrum groups in each direction are compared according to the frequency spectrum matrix and the corresponding frequency spectrum information, the direction pointed by the frequency spectrum group with the maximum amplitude value square sum is taken as a machining direction x, and the direction perpendicular to the machining direction x is taken as a feeding direction y.

S400, the feeding spacing w in the y-axis direction is selected according to the required machining precision, and the cross-scale structure feature surface is divided according to the spacing w in the y-axis direction to divide the cross-scale structure feature surface into L units; frequency spectrum analysis is performed on each unit; the frequency spectrum information of each unit in x-axis direction is extracted to obtain the components of the spatial frequency spectrum of the cross-scale structure feature surface (spatial frequency spectrum 1-spatial frequency spectrum L); the frequency spectrum parameters of each group of spatial frequency spectrum includes a spatial frequency, an amplitude value, a phase angle, and a direction; and a height, a cycle, and a distance of each cosine contour forming the cross-scale structure feature surface are calculated by using the frequency spectrum parameters.

Specifically, when the cross-scale structure includes a nanometer-scale structure, the movement trajectory parameters of the cutting machining are obtained by the following steps:

S510, the frequency of an elliptic vibration is selected, and the movement trajectory parameters (A, $B_1$, $\varphi_1$, v) are determined according to $d_1$, $h_1$ and a determined in S400.

S520, the movement trajectory parameters ($B_2$, v, $f_2$) are determined according to v determined in S510 and the spacing $d_2$ and the height $h_2$ of the micron-scale structures; and when a cross-scale structure does not include a micron-scale structure, $f_2=0$, $B_2=0$.

S530, the movement trajectory parameters ($B_3$, v, $f_3$) are determined according to v determined in S510 and the spacing $d_3$ and the height $h_3$ of the millimeter-scale structure; and when a cross-scale structure does not include a micron-scale structure, $f_3=0$, $B_3=0$.

When the cross-scale structure includes a micron-scale structure and a millimeter-scale structure, the movement trajectory parameters of the cutting machining are obtained by the following steps:

S610, the vibration frequency $f_2$ of a servo movement mechanism is selected, and the movement trajectory parameters ($B_2$, v, $f_2$) are determined according to the spacing $d_2$ and the height $h_2$ of the micron-scale structure.

S620, the movement trajectory parameters ($B_3$, v, $f_3$) are determined according to v determined in S610 and the spacing $d_3$ and the height $h_3$ of the millimeter-scale structure.

It is to be noted that the contour of any given curved surface can be regarded as the superposition of a plurality of sine plane waves or a plurality of cosine plane waves. In the embodiment of the present disclosure, the contour of the given curved surface is regarded as the superposition of a plurality of cosine plane waves. In an actual machining process, it is difficult to give consideration to plane waves in all directions, so a machining direction x and a feeding direction y during actual machining are determined in S300, that is, the plane waves in which direction are superimposed to obtain the required contour is determined. After the machining direction x and the feeding direction y are determined, the given contour is divided into L units by dividing the given contour according to the spacing w in the feeding direction y in S400. When frequency spectrum analysis is performed on each unit, the components of the contour of each unit along the cross section xoz are mainly analyzed, and the frequency spectrum information of each unit in the x-axis direction is extracted.

For example, if the components of the ith unit of the given contour obtained through the frequency spectrum analysis are that the spatial frequency is $F_{i1}, F_{i1}, F_{i3}, \ldots, F_{in}$, the corresponding amplitude values are $H_{i1}, H_{i2}, H_{i3}, \ldots, H_{in}$, and the corresponding phase angles are $\psi_{i1}, \psi_{i2}, \psi_{i3}, \ldots, \psi_{in}$ then the components are respectively represented by functions as follows:

$$Z_{i1} = H_{i1} \cos(2\pi F_{i1} X + \psi_{i1});$$

$$Z_{i2} = H_{i2} \cos(2\pi F_{i2} X + \psi_{i2});$$

$$Z_{i3} = H_{i3} \cos(2\pi F_{i3} X + \psi_{i3});$$

$$\ldots$$

$$Z_{in} = H_{in} \cos(2\pi F_{in} X + \psi_{in});$$

the equation of an actual contour is the superposition of the abovementioned equations:

$$Z_i = H_{i1} \cos(2\pi F_{i1}X+\psi_{i1}) + H_{i2} \cos(2\pi F_{i2}X+\psi_{i2}) + H_{i3}\cos(2\pi F_{i3}X+\psi_{i3})+ \ldots +H_{in} \cos(2\pi F_{in}X+\psi_{in});$$

a height h and a distance d of the contour of each component, or the horizontal distance a between the highest point of the nanometer-scale structure and the closest lowest point thereof in a cutting direction can be respectively calculated through the abovementioned equation:

$$h_{i1} = 2*H_{i1}; d_{i1} = \frac{1}{F_{i1}}; a = d_{i1}/2;$$

$$h_{i2} = 2*H_{i2}; d_{i2} = \frac{1}{F_{i2}}; a = d_{i2}/22;$$

$$h_{i3} = 2*H_{i3}; d_{i3} = \frac{1}{F_{i3}}; a = d_{i3}/2;$$

$$\ldots$$

$$h_{in} = 2*H_{in}; d_{in} = \frac{1}{F_{in}}; a = d_{in}/2;$$

the abovementioned components are divided into a nanometer scale, a micron scale, and a millimeter scale according to the height h, and respective movement trajectory parameters are obtained according to respective algorithms of the nanometer scale, the micron scale, and the millimeter scale.

Specifically, for example:

when the nanometer-scale structure is composed of m cosine components, the frequency spectrum information of the cosine information is that the frequency is $F_{11}, F_{12}, \ldots, F_{1m}$, the amplitude value is $H_{11}, H_{12}, \ldots, H_{1m}$, and the phase angle is $\psi_{11}, \psi_{12} \ldots \psi_{1m}$, then the contour equation of the nanometer-scale structure is:

$$Z_1 = H_{11} \cos(2\pi F_{11}X+\psi_{11})+H_{12} \cos(2\pi F_{12}X+\psi_{12})+ \ldots +H_{1m} \cos(2\pi F_{1m}X+\psi_{1m}),$$

through the abovementioned contour equation, the spacing $d_1$ between the nanometer-scale structures, the height $h_1$ of the nanometer-scale structure, and the horizontal distance a between the highest point of the nanometer-scale structure and the closest lowest point thereof in the cutting direction can be calculated, and then the movement trajectory parameters are calculated according to a formula corresponding to the nanometer-scale structure.

When the nanometer-scale structure is composed of m cosine components, the frequency spectrum information of the cosine information is that the frequencies are $F_{21}, F_{22}, \ldots, F_{2m}$, the amplitude values are $H_{21}, H_{22}, \ldots, H_{2m}$, and the phase angles are $\psi_{21}, \psi_{22}, \ldots, \psi_{2m}$, then the height h and the spacing d of the contour of each cosine component can be respectively calculated, and various movement trajectory parameters v, $f_{21}, f_{22}, \ldots, f_{2m}, B_{21}, B_{22}, \ldots, B_{2m}$, and $\varphi_{21}, \varphi_{22}, \ldots, \varphi_{2m}$ are calculated according to a formula corresponding to the micron-scale structure. At this moment, a position equation of the vibration of the workpiece is:

$$z=B_{21} \cos(2\pi f_{21}t+\varphi_{21})+B_{22} \cos(2\pi f_{22}t+\varphi_{22})+ \ldots +B_2m \cos(2\pi f_{2m}t+\varphi_{2m});$$

The movement trajectory of the vibrating tool relative to the workpiece satisfies:

$$x=vt;$$

$$z=B_{21} \cos(2\pi f_{21}t+\varphi_{21})+B_{22} \cos(2\pi f_{22}t+\varphi_{22})+ \ldots +B_{2m} \cos(2\pi f_{2m}t+\varphi_{2m});$$

when the millimeter-scale structure is composed of m cosine components, the frequency spectrum information of the cosine information is that the frequencies are $F_{31}, F_{32}, \ldots, F_{3m}$, the amplitude values are $H_{31}, H_{32}, \ldots, H_{3m}$, and the phase angles are $\psi_{31}, \psi_{32}, \ldots, \psi_{3m}$, then the height h and the spacing d of the contour of each cosine component can be respectively calculated, and various movement trajectory parameters v, $f_{31}, f_{32}, \ldots, f_{3m}, B_{31}, B_{32}, \ldots, B_{3m}$, $\varphi_{31}, \varphi_{32}, \ldots, \varphi_{3m}$ are calculated according to a formula corresponding to the millimeter-scale structure. At this moment, a position equation of the vibration of the workpiece is:

$$z=B_{31} \cos(2\pi f_{31}t+\varphi_{31})+B_{32} \cos(2\pi f_{32}t+\varphi_{32})+ \ldots +B_{3m} \cos(2\pi f_{3m}t+\varphi_{3m});$$

The movement trajectory of the vibrating tool relative to the workpiece satisfies:

$$x=vt;$$

$$z=B_{31} \cos(2\pi f_{31}t+\varphi_{31})+B_{32} \cos(2\pi f_{32}t+\varphi_{32})+ \ldots +B_{3m} \cos(2\pi f_{3m}t+\varphi_{3m});$$

Specifically, the components of each group of spatial frequency spectrum correspond to a group of process parameters S. Each group of process parameters S includes a group of movement trajectory parameters (A, $B_1$, $\varphi_1$, v), ($B_2$, v, $f_2$), and/or ($B_3$, v, $f_3$); and the spatial frequency spectrum 1-spatial frequency spectrum L corresponds to the process parameters $S_1, S_2, S_3, \ldots S_l$.

Specifically, during the cutting machining of a surface of a workpiece, the following steps are included:

S710, process parameters $S_1, S_2, S_3 \ldots S_l$ and a y-directional feeding spacing w are input into a cutting process system.

S720, the cutting process system is enabled to perform collaborative movement according to the process parameter $S_1$ and to return the workpiece to an initial position after forming a first section of structure on the surface of the workpiece.

S730, a vibrating tool is fed for a certain distance w in the y-axis direction.

S730, the cutting process system is enabled to perform the collaborative movement according to the process parameter $S_2$ and to return the workpiece to an initial position after forming a second section of structure on the surface of the workpiece.

S740, the vibrating tool is fed for a certain distance w in the y-axis direction.

. . .

The vibrating tool is fed for a certain distance w in the y-axis direction after a section of structure is formed on surface of the workpiece by performing the collaborative vibration according to a group of process parameter S each time, until the required cross-scale structure is formed according to L groups of process parameters. It is to be noted that the feeding distance w is related to the given machining precision δ, so when the given machining precision is different, the values of the feeding distance will also be different.

After the process parameters $S_1, S_2, S_3 \ldots S_l$ are obtained, the quality of the blank of the workpiece is analyzed, and the workpiece is precut as required. For example, if the quality of the blank of the workpiece is too poor to meet a requirement of cutting directly, the workpiece needs to be precut. Specifically, the vibrating tool is a diamond tool, and the cutting edge radius of the vibrating tool ranges from 50 nm to 200 nm. The cutting edge radius characterizes the sharpness of the vibrating tool. The smaller the cutting edge radius is, the sharper the vibrating tool is, and the easier it is to machine a high-quality nanometer-scale structure, but meanwhile, the easier it is to wear the vibrating tool, so the cutting edge radius of the vibrating tool is limited between 50 nm and 200 nm.

tool, and the contour obtained by machining is not limited by cutting edge parameters of the vibrating tool.

Figure 8:
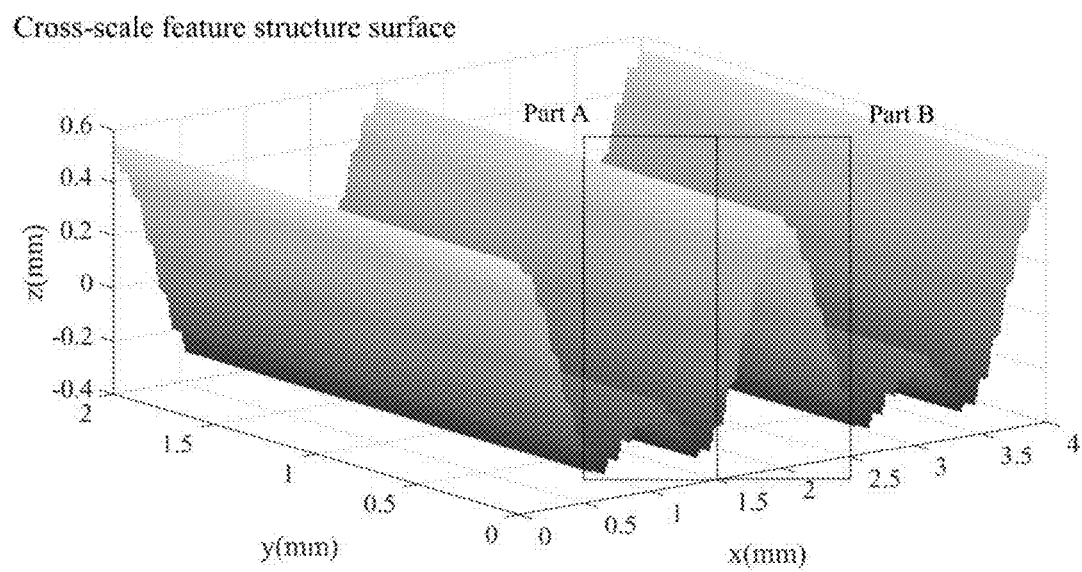
FIG. 8 is a curved surface diagram of a given cross-scale structure in an embodiment of the present disclosure.
Figure 9:
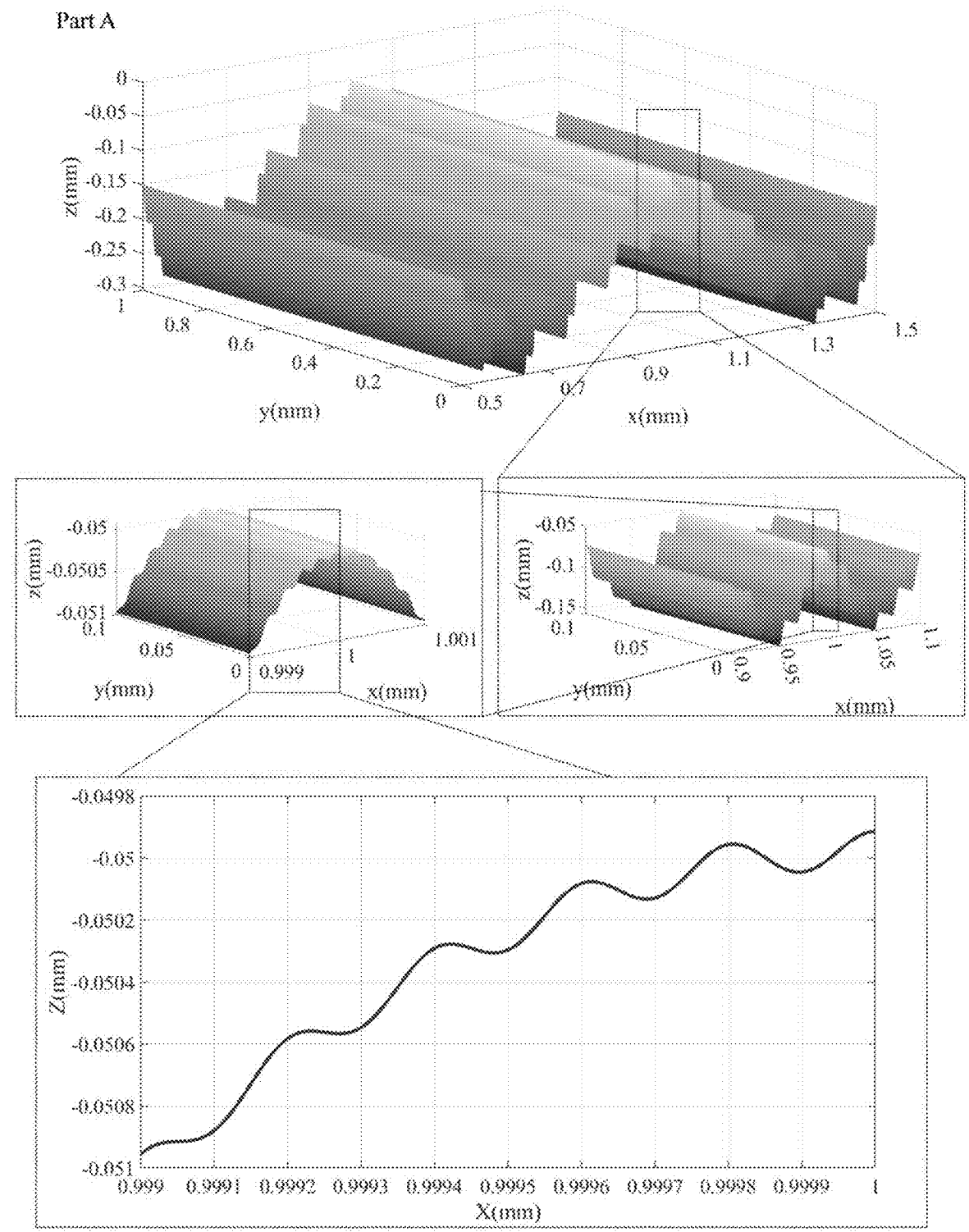
FIG. 9 is a schematic diagram of part A in FIG. 8.
Figure 10:
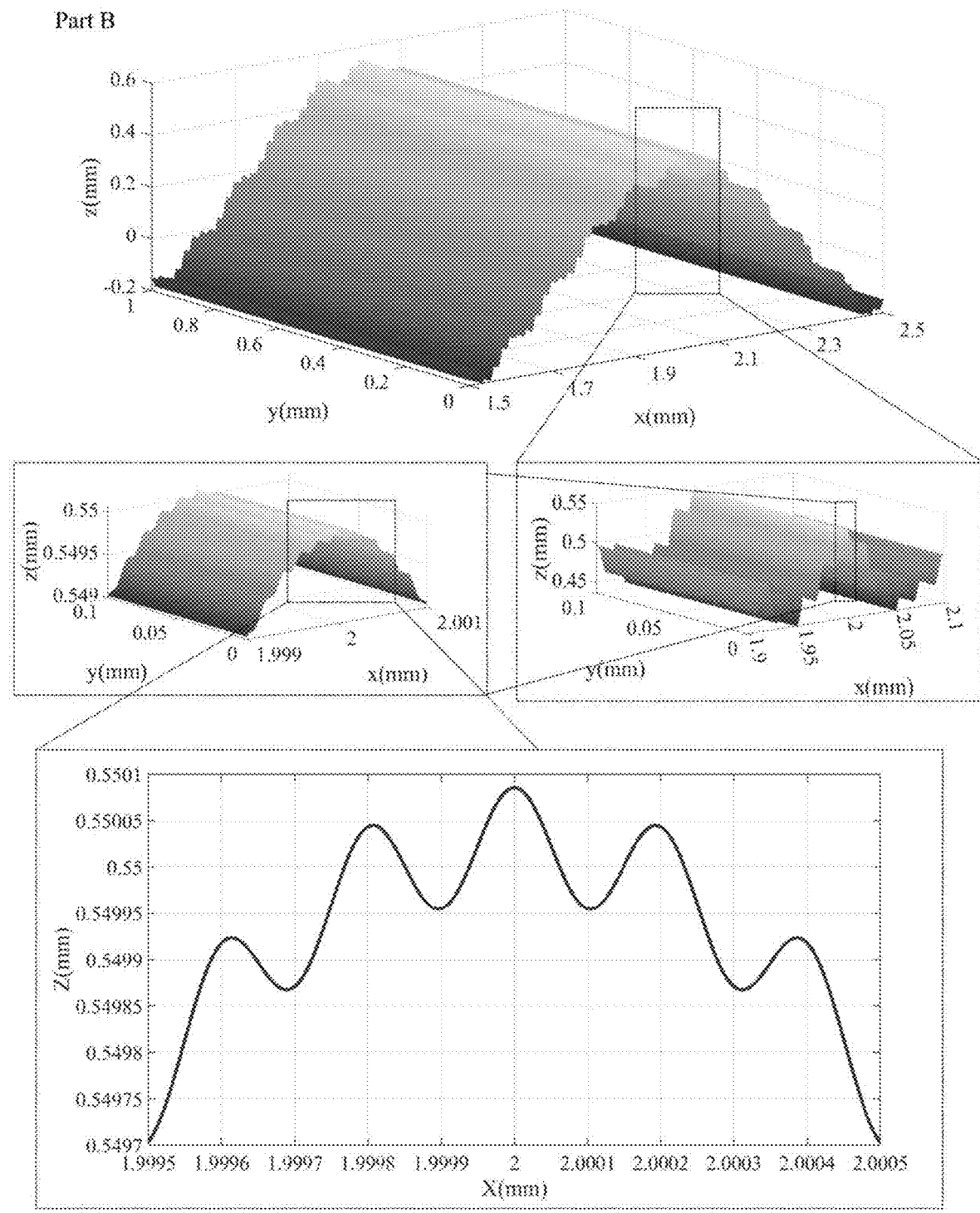
FIG. 10 is a schematic diagram of part B in FIG. 8.

A specific machining implementation process is provided below:

FIG. 8 to FIG. 10 are given feature surfaces with millimeter-micron-nanometer cross-scale structures (a unit in the figures is mm), and the given machining precision δ is 10 nm.

Figure 11:
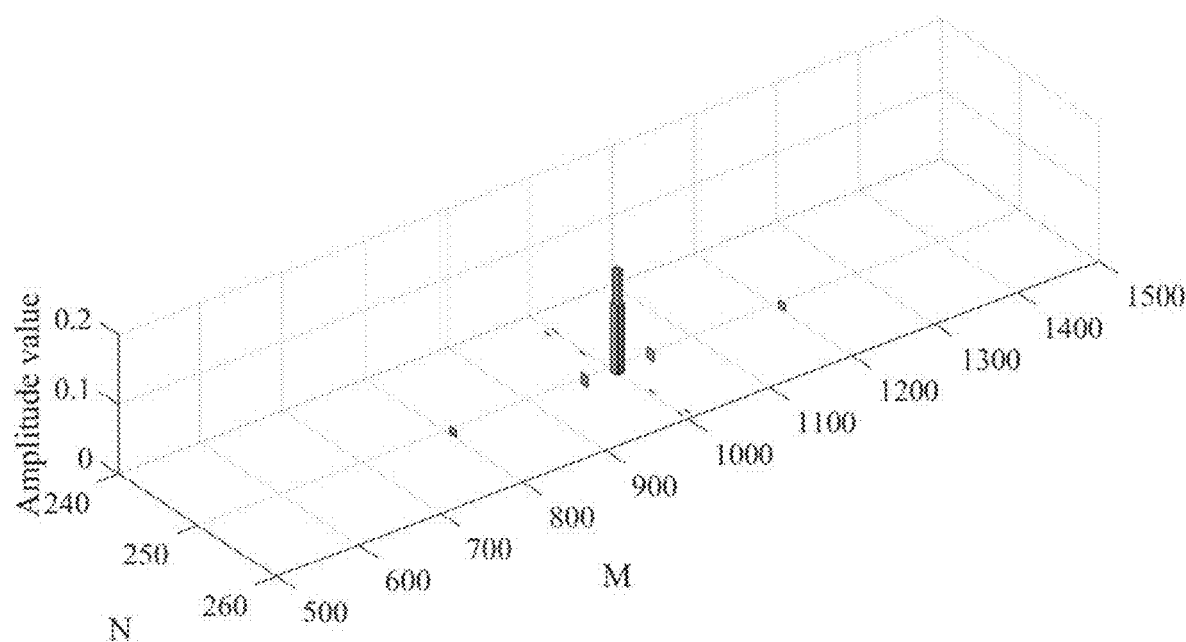
FIG. 11 is a spectrogram obtained by frequency spectrum analysis.

Step 1: preliminary spectrum analysis is performed on a feature surface of a given cross-scale structure, and two-dimensional discrete fast Fourier transform is performed on a given curved surface by using Matlab. An obtained spectrogram is as shown in FIG. 11 (where, the coordinate direction in FIG. 11 is the same as that in FIG. 8). It can be determined from FIG. 11 that the x-axis direction of the curved surface is a machining direction x, and the y-axis of the curved surface is the feeding direction y during machining. It can be known from the spectrogram that a main component forming the curved surface is x-directional plane waves, and y-directional plane waves forming the curved surface are less and extremely small in amplitude (less than 10 nm). Therefore, the frequency spectrum of the x-directional plane waves of the component of the curved surface is mainly extracted and the y-directional frequency spectrum is discarded.

Step 2: a y-directional feeding distance W and a feeding frequency L are determined. Since δ is 10 nm, it can be obtained that w≤2.82*10$^{-3}$ mm (the cutting edge radius of the vibrating tool r=100 μm), taking w=2.5*10$^{-3}$ mm, so L=400.

Step 3: the curved surface is divided into 400 unit curved surfaces at equal distance (L=400) in the y-axis direction. It is determined that only the component in a single direction (x-axis direction) is considered during the machining of the curved surface in step 1, so only the x-directional component frequency spectrum of any unit needs to be accurately analyzed this time. Accurate analysis of the x-directional component frequency spectrum is as shown in the following table:

TABLE 1

| Structure scale | Nanometer | Micron | Micron | Millimeter | Millimeter | Millimeter | Millimeter | Micron | Micron | Nanometer |
|---|---|---|---|---|---|---|---|---|---|---|
| Spatial frequency | 5000 | 50 | 10 | 1 | 0.5 | 0.5 | 1 | 10 | 50 | 5000 |
| Amplitude | 2.5*10$^{-5}$ | 0.01 | 0.015 | 0.1 | 0.15 | 0.15 | 0.1 | 0.015 | 0.01 | 2.5*10$^{-5}$ |
| Phase angle (rad) | 0 | 0 | 0 | 0 | 0 | 0 | 0 | 0 | 0 | 0 |
| Direction | X-direction | X-direction | X-direction | X-direction | X-direction | X-direction | X-direction | X-direction | X-direction | X-direction |

It can be known from the abovementioned description that the method has the following advantages:

1. According to the method, during machining, there is no other consumable except for the normal wear of a blade of the vibrating tool, so that the machining cost can be reduced.

2. The machining process of the method is simple. A system can be started to machine only after analyzing the contour of a given cross-scale structure, calculating process parameters, inputting the process parameters into the system, and clamping a workpiece. One-time forming is achieved during the machining without other operations, so that a process flow can be simplified and the machining efficiency can be improved.

3. By the method, the contour of the required cross-scale structure is formed by using the trajectory of the vibrating Step four: from the data in Table 1, the structure feature dimension parameters of nanometer scale, micron scale, and millimeter scale are calculated as follows (in Table 1, the amplitude values of components at the same spatial frequency and phase angle are superposed first to obtain a total amplitude value, and then the height h is calculated according to a formula):

TABLE 2

| Structure scale Height h (mm) | Nanometer | Micron | Micron | Millimeter | Millimeter |
|---|---|---|---|---|---|
| Structure spacing d (mm) | 10$^{-4}$ | 0.04 | 0.06 | 0.4 | 0.6 |
| Spacing a (mm) | 2*10$^{-4}$ | 0.02 | 0.1 | 1 | 2 |

TABLE 2-continued

| Structure scale Height h (mm) | Nanometer | Micron | Micron | Milli-meter | Milli-meter |
|---|---|---|---|---|---|
| Phase angle (rad) | $10^{-4}$ | 0.01 | 0.05 | 0.5 | 1 |
|  | 0 | 0 | 0 | 0 | 0 |

Step 5: movement trajectory parameters (A, $B_1$, $\varphi_1$, v), ($B_2$, v, $f_2$) and/or ($B_3$, v, $f_3$) are determined:

Machining of Nanometer-Scale Structure:

TABLE 3

| Amplitude A (um) | Amplitude $B_1$ (um) | Phase angle $\varphi_1$ (rad) | Frequency $f_1$ (Hz) |
|---|---|---|---|
| 0.5 | 3 | $3\pi/2$ | 41000 |

Machining of Micron-Scale Structure:

TABLE 4

| Amplitude $B_{21}$ (um) | Phase angle $\varphi_{21}$ (rad) | Frequency $f_{21}$ (Hz) |
|---|---|---|
| 0.02 | 0 | 410 |
| Amplitude $B_{22}$ (um) | Phase angle $\varphi_{22}$ (rad) | Frequency $f_{22}$ (Hz) |
| 0.03 | 0 | 82 |

Machining of Millimeter-Scale Structure:

TABLE 5

| Z-axis vibration parameters | | |
|---|---|---|
| Amplitude $B_{31}$ (um) | Phase angle $\varphi_{31}$ (rad) | Frequency $f_{31}$ (Hz) |
| 0.2 | 0 | 8.2 |
| Amplitude $B_{32}$ (um) | Phase angle $\varphi_{32}$ (rad) | Frequency $f_{32}$ (Hz) |
| 0.3 | 0 | 4.1 |
| X-axis movement speed v | 8.2 mm/s | |
| Y-axis feeding space w | 2.5 μm | |

From the parameters in Table 2 to Table 5, it is obtained that:

the movement trajectory of the vibrating tool:

$x=0.5*10^{-3}*\cos(82000\pi t)$ $z=3*10^{-3}*\cos(820007\pi t+\pi/2)$ the movement trajectory of the servo movement mechanism:

$z=0.02*\cos(820\pi t)+0.03*\cos(164\pi t)$ the movement trajectory of the three-axis movement platform:

$x=8.2*t$ $z=0.2\cos(16.47\pi t)+0.3\cos(8.2\pi t)$ the position relationship the tool relative to the workpiece:

$$x = 0.5 * 10^{-3} * \cos(82000\pi t) + 8.2t$$

$$z = 3*10^{-3} * \cos\left(82000\pi t + \frac{3\pi}{2}\right) + 0.02 * \cos(820\pi t) +$$
$$0.03 * \cos(164\pi t) + 0.2\cos(16.4\pi t) + 0.3\cos(8.2\pi t) + 0.00295$$

Step 6: each component moves according to the trajectory designed in the previous step, x-axis direction is a cutting direction, z-axis direction is a cutting depth direction, and y-axis direction is a feeding direction. The tool will return to a cutting starting point of this time after cutting a curved surface unit in the x-axis direction, then is fed by a distance of 2.5 μm to the y-axis direction, and then cuts the next curved surface unit in the x-axis direction. The machining of the whole curved surface is completed by repeating this cycle.

Figure 12:
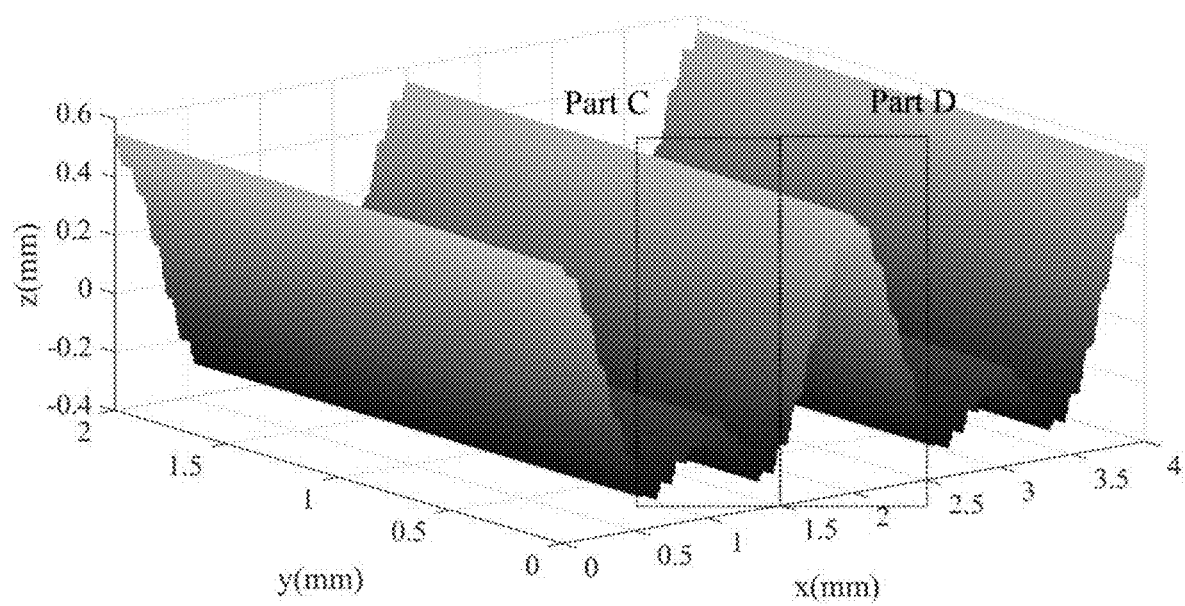
FIG. 12 is a schematic diagram of a machined and formed cross-scale structure.
Figure 13:
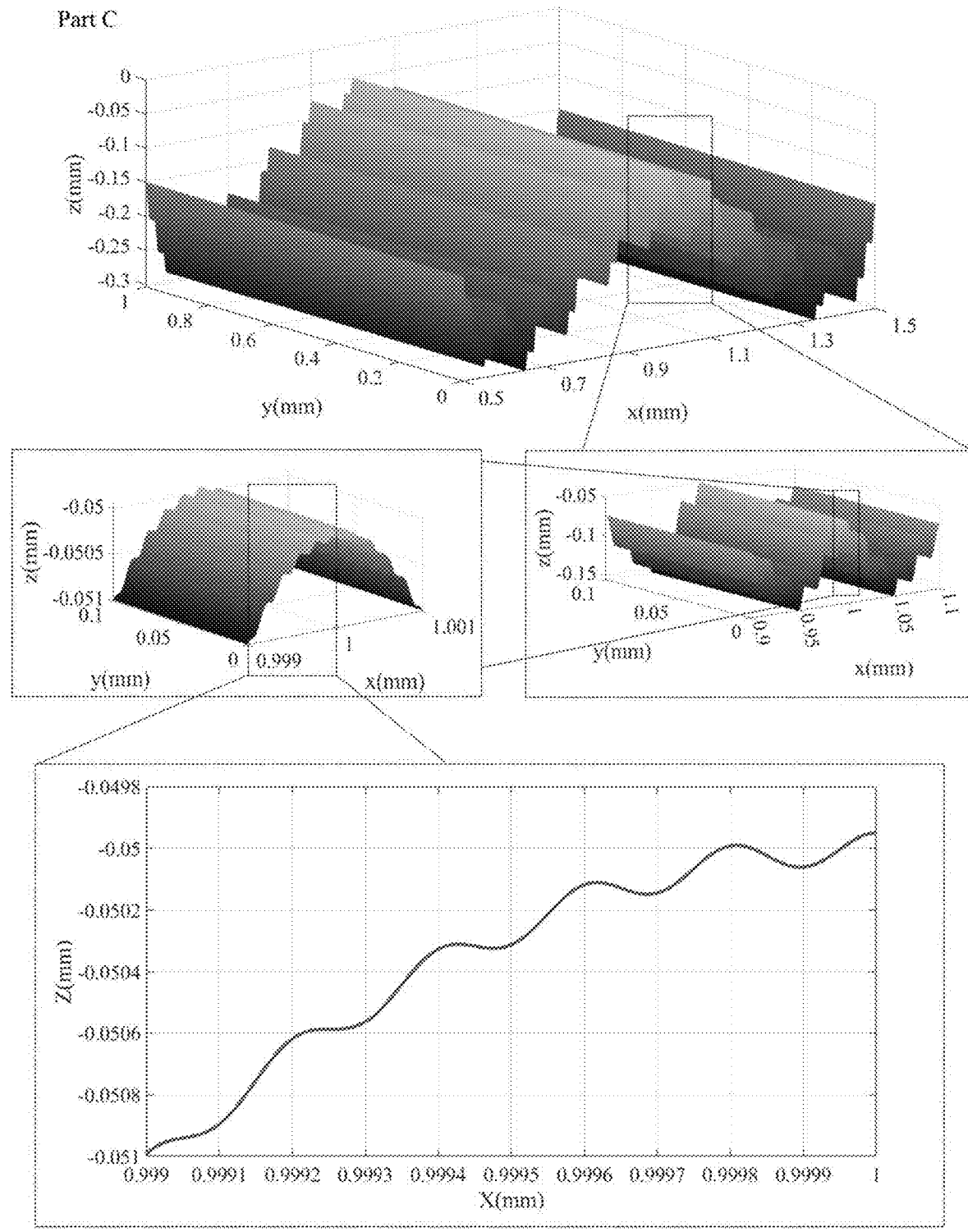
FIG. 13 is a partially enlarged view of position C in FIG. 12.
Figure 14:
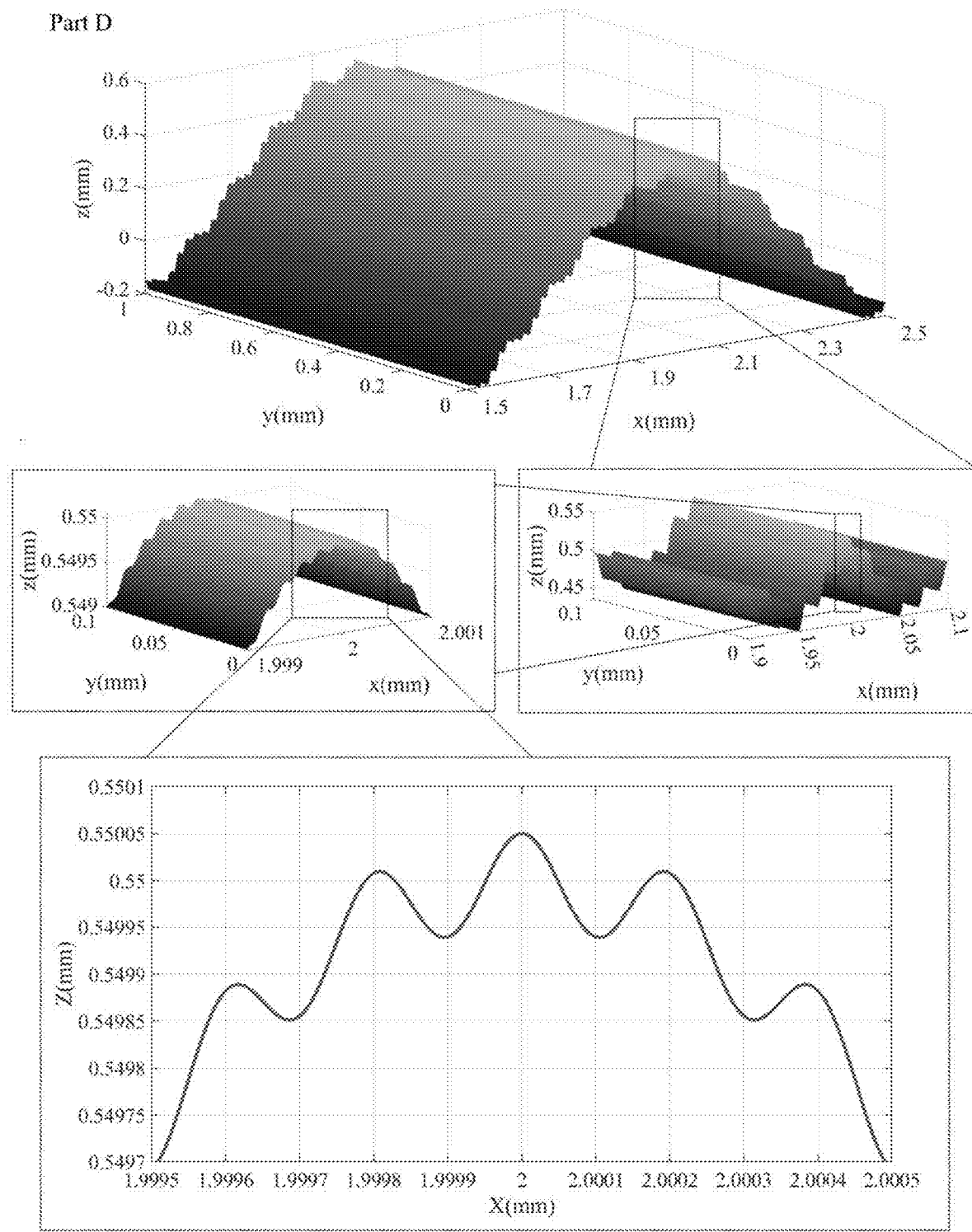
FIG. 14 is a partially enlarged view of position D in FIG. 12.

After the machining is completed, three-dimensional features of the cross-scale structure surface are obtained by scanning by using an atomic force microscope and analyzing through supporting software nanoscope analysis, and an obtained local contour is as shown in FIG. 12 to FIG. 14. The morphological features, dimensions, etc. (such as structure height and the spacing between adjacent structures) of a structure of each scale are extracted and measured by this software. Finally, a machining effect can be evaluated on the basis of a deviation obtained by comparing measurement results and given values. From the contours of cross sections in FIG. 13, FIG. 14, FIG. 9, and FIG. 10, the machined cross-scale structure has high similarity with the contour of the given curved surface.

It is to be noted that the data in Table 1 are calculated by performing Fourier transform by using matlab. Part data of the spatial frequency and the amplitude value are embodied in FIG. 11, but cannot be fully embodied in the figure because the spatial frequency span is too large. In FIG. 11, a column height is an amplitude value, and the spatial frequency is calculated by programming (but the program design is not the key point to be protected by the present disclosure, so a specific program is not provided here), which is related to the distance of a center point (251, 1001) of the column distance, the sampling frequency, the number of sampling points, etc. during the Fourier transform. Part frequency spectrum in FIG. 11 is shown in a table below.

TABLE 6

|  | 993 | 994 | 995 | 996 | 997 | 998 | 999 | 1000 | 1001 |
|---|---|---|---|---|---|---|---|---|---|
| 243 | 5.0000e−06 | 0 | 0 | 0 | 0 | 0 | 0 | 0 | 5.0000e−06 |
| 244 | 0 | 0 | 0 | 0 | 0 | 0 | 0 | 0 | 0 |
| 245 | 0 | 0 | 0 | 0 | 0 | 0 | 0 | 0 | 0 |
| 246 | 0 | 0 | 0 | 0 | 0 | 0 | 0 | 0 | 0 |
| 247 | 0 | 0 | 0 | 0 | 5.0000e−06 | 0 | 0 | 0 | 0 |
| 248 | 0 | 0 | 0 | 0 | 0 | 0 | 0 | 0 | 0 |
| 249 | 0 | 0 | 0 | 0 | 0 | 0 | 0 | 0 | 0 |
| 250 | 0 | 0 | 0 | 0 | 0 | 0 | 0 | 0 | 0 |
| 251 | 0 | 0 | 0 | 0 | 0.1000 | 0 | 0.1500 | 0 | 5.0000e−05 |
| 252 | 0 | 0 | 0 | 0 | 0 | 0 | 0 | 0 | 0 |

TABLE 6-continued

| | | | | | | | | | |
|---|---|---|---|---|---|---|---|---|---|
| 253 | 0 | 0 | 0 | 0 | 0 | 0 | 0 | 0 | 0 |
| 254 | 0 | 0 | 0 | 0 | 0 | 0 | 0 | 0 | 0 |
| 255 | 0 | 0 | 0 | 0 | 0 | 0 | 0 | 0 | 0 |
| 256 | 0 | 0 | 0 | 0 | 0 | 0 | 0 | 0 | 0 |
| 257 | 0 | 0 | 0 | 0 | 0 | 0 | 0 | 0 | 0 |
| 258 | 0 | 0 | 0 | 0 | 0 | 0 | 0 | 0 | 0 |
| 259 | 0 | 0 | 0 | 0 | 0 | 0 | 0 | 0 | 5.0000e−06 |

| | 1002 | 1003 | 1004 | 1005 | 1006 | 1007 | 1008 | 1009 |
|---|---|---|---|---|---|---|---|---|
| 243 | 0 | 0 | 0 | 0 | 0 | 0 | 0 | 0 |
| 244 | 0 | 0 | 0 | 0 | 0 | 0 | 0 | 0 |
| 245 | 0 | 0 | 0 | 0 | 0 | 0 | 0 | 0 |
| 246 | 0 | 0 | 0 | 0 | 0 | 0 | 0 | 0 |
| 247 | 0 | 0 | 0 | 0 | 0 | 0 | 0 | 0 |
| 248 | 0 | 0 | 0 | 0 | 0 | 0 | 0 | 0 |
| 249 | 0 | 0 | 0 | 0 | 0 | 0 | 0 | 0 |
| 250 | 0 | 0 | 0 | 0 | 0 | 0 | 0 | 0 |
| 251 | 0 | 0.1500 | 0 | 0.1000 | 0 | 0 | 0 | 0 |
| 252 | 0 | 0 | 0 | 0 | 0 | 0 | 0 | 0 |
| 253 | 0 | 0 | 0 | 0 | 0 | 0 | 0 | 0 |
| 254 | 0 | 0 | 0 | 0 | 0 | 0 | 0 | 0 |
| 255 | 0 | 0 | 0 | 5.0000e−06 | 0 | 0 | 0 | 0 |
| 256 | 0 | 0 | 0 | 0 | 0 | 0 | 0 | 0 |
| 257 | 0 | 0 | 0 | 0 | 0 | 0 | 0 | 0 |
| 258 | 0 | 0 | 0 | 0 | 0 | 0 | 0 | 0 |
| 259 | 0 | 0 | 0 | 0 | 0 | 0 | 0 | 5.0000e−06 |

It is to be noted that, in the description of the present disclosure, if orientation description, for example, orientations or positional relationships indicated by "upper", "lower", "front", "rear", "left", "right", etc. are orientations or positional relationships shown based on the accompanying drawings are involved, they are only used for facilitating describing the present disclosure and simplifying the description, rather than indicating or implying that the devices or elements must have particular orientations, and constructed and operated in particular orientations. Thus, it cannot be construed as a limitation to the present disclosure.

In the description of the present disclosure, "several" means one or more, "a plurality of" means two or more, "greater than, less than, more than, etc." means not including the number, and "above, below, within, etc." means including the number. If "first", "second", etc. are described, they are only used for distinguishing technical features, but cannot be construed as indicating or implying relative importance or implicitly indicating the number of indicated technical features or implicitly indicating the precedence relationship of the indicated technical features.

In the description of the present disclosure, unless otherwise specified, the words, such as arranged, mounted, and connected shall be interpreted broadly. Those skilled in the art can reasonably determine specific meanings of the abovementioned words in the present disclosure in combination with the specific content of the technical solution.

The abovementioned embodiments are only preferred embodiments of the present disclosure, and cannot be used to limit the scope of protection of the present disclosure. Any non-substantial changes and replacements made by those skilled in the art on the basis of the present disclosure belong to the scope of protection claimed by the present disclosure.

What is claimed is:

1. A cross-scale structure feature surface machining method based on a multi-component collaborative vibration, wherein a workpiece is machined by using a cutting process system; the cutting process system comprises a base, a three-axis movement platform, a servo movement mechanism, and a vibrating tool; both the three-axis movement platform and the vibrating tool are mounted on the base; the servo movement mechanism is mounted on the three-axis movement platform; the workpiece is mounted at an end-effector of the servo movement mechanism; a cross-scale structure comprises at least two of a nanometer-scale structure, a micron-scale structure, and a millimeter-scale structure; during cutting machining, the three-axis movement platform enables the workpiece to move in an x-axis, and a required cross-scale structure is formed in a surface of the workpiece through a collaborative vibration among the vibrating tool, the servo movement mechanism, and/or the three-axis movement platform according to the structure type contained in the cross-scale structure;
   when the cross-scale structure comprises a nanometer-scale structure, an elliptic vibration is applied to the vibrating tool; a vibration plane of the elliptic vibration is located on an xoz plane; the frequency $f_1$ of the elliptic vibration is less than 2000 Hz;
   when the cross-scale structure comprises a micron-scale structure, a vibration is applied to the servo movement mechanism, the vibration direction is in a z-axis direction, and the frequency $f_2$ of the vibration ranges from 10 Hz to 2000 Hz; and
   when the cross-scale structure comprises a millimeter-scale structure, a vibration is applied to the three-axis movement platform, the vibration direction is in a z-axis direction, and the frequency $f_3$ of the vibration is not greater than 10 Hz.

2. The cross-scale structure feature surface machining method based on a multi-component collaborative vibration according to claim 1, wherein during cutting machining, after a first section of structure is formed on a surface of the workpiece, the workpiece is returned to an initial position, the vibrating tool is fed for a certain distance w along a y-axis direction, and then a second section of structure is formed on the surface of the workpiece; and a cycle of forming a section of structure is repeated discontinuously until the required cross-scale structure is formed on the surface of the workpiece.

3. The cross-scale structure feature surface machining method based on a multi-component collaborative vibration according to claim 2, wherein the feeding distance w of the vibrating tool in the y-axis direction satisfies that:

$$\delta \geq \frac{w^2}{8r};$$

wherein δ is the required machining precision, and r is a cutting edge radius of the vibrating tool.

4. The cross-scale structure feature surface machining method based on a multi-component collaborative vibration according to claim 3, wherein when an elliptic vibration is applied to the vibrating tool, a position parameter equation of the vibrating tool satisfies:

$$\begin{cases} x = A\cos(2\pi f_1 t) \\ z = B_1 \cos(2\pi f_1 t + \varphi_1) \end{cases};$$

wherein A is the amplitude of the elliptic vibration in the x-axis direction, $B_1$ is the amplitude of the elliptic vibration in the z-axis direction, and $\varphi_1$ is a phase difference of vibration displacement in the x-axis direction and the z-axis direction; during cutting machining, the movement trajectory of the vibrating tool relative to the workpiece satisfies:

$$x = A\cos(2\pi f_1 t) + vt;$$

$$z = B_1 \cos(2\pi f_1 t + \varphi_1);$$

the movement trajectory parameters (A, $B_1$, $\varphi_1$, v) satisfy:

$$v = d_1 * f_1;$$

$$d_1\left(\frac{\gamma - \pi}{2\pi}\right) - A(\cos(\varphi_1 - \gamma) + \cos\varphi_1) = a;$$

$$\frac{2\pi f_1 A \sin\varphi_1 \sin\gamma}{v} + \gamma = 0;$$

$$h_1 = B_1(1 + \cos\gamma);$$

wherein v is a speed at which the three-axis movement platform enables the workpiece to move in an x-axis direction, $d_1$ is a spacing between nanometer-scale structures, $h_1$ is a height of the nanometer-scale structure, a is the horizontal distance between the highest point of the nanometer-scale structure and the closest lowest point thereof in a cutting direction, γ satisfies:

$$\gamma = \pi f_1 (t_1 - t_2);$$

wherein in an elliptic vibration cycle, $t_1$ is the time that the vibrating tool moves to a trajectory overlapping point from bottom to top, and $t_2$ is the time that the vibrating tool moves to the trajectory overlapping point from top to bottom.

5. The cross-scale structure feature surface machining method based on a multi-component collaborative vibration according to claim 2, wherein when an elliptic vibration is applied to the vibrating tool, a position parameter equation of the vibrating tool satisfies:

$$\begin{cases} x = A\cos(2\pi f_1 t) \\ z = B_1 \cos(2\pi f_1 t + \varphi_1) \end{cases};$$

wherein A is the amplitude of the elliptic vibration in the x-axis direction, $B_1$ is the amplitude of the elliptic vibration in the z-axis direction, and $\varphi_1$ is a phase difference of vibration displacement in the x-axis direction and the z-axis direction; during cutting machining, the movement trajectory of the vibrating tool relative to the workpiece satisfies:

$$x = A\cos(2\pi f_1 t) + vt;$$

$$z = B_1 \cos(2\pi f_1 t + \varphi_1);$$

the movement trajectory parameters (A, $B_1$, $\varphi_1$, v) satisfy:

$$v = d_1 * f_1;$$

$$d_1\left(\frac{\gamma - \pi}{2\pi}\right) - A(\cos(\varphi_1 - \gamma) + \cos\varphi_1) = a;$$

$$\frac{2\pi f_1 A \sin\varphi_1 \sin\gamma}{v} + \gamma = 0;$$

$$h_1 = B_1(1 + \cos\gamma);$$

wherein v is a speed at which the three-axis movement platform enables the workpiece to move in an x-axis direction, $d_1$ is a spacing between nanometer-scale structures, $h_1$ is a height of the nanometer-scale structure, a is the horizontal distance between the highest point of the nanometer-scale structure and the closest lowest point thereof in a cutting direction, γ satisfies:

$$\gamma = \pi f_1 (t_1 - t_2);$$

wherein in an elliptic vibration cycle, $t_1$ is the time that the vibrating tool moves to a trajectory overlapping point from bottom to top, and $t_2$ is the time that the vibrating tool moves to the trajectory overlapping point from top to bottom.

6. The cross-scale structure feature surface machining method based on a multi-component collaborative vibration according to claim 5, wherein when a vibration is applied to a servo movement mechanism, the servo movement mechanism drives the workpiece to vibrate together, and a position equation during the vibration of the workpiece satisfies:

$$z = B_2 \cos(2\pi f_2 t + \varphi_2);$$

wherein $B_2$ is the amplitude of the workpiece in the z-axis direction, $\varphi_2$ is a phase angle when a contour that needs to be machined is represented by a cosine function; and during cutting machining, the movement trajectory of the vibrating tool relative to the workpiece satisfies:

$$x = vt;$$

$$z = B_2 \cos(2\pi f_2 t + \varphi_2);$$

the movement trajectory parameters ($B_2$, v, $f_2$) satisfy:

$$v = d_2 * f_2;$$

$$B_2 = \frac{h_2}{2};$$

wherein $d_2$ is a spacing between micron-scale structures, and the $h_2$ is a height of a micron-scale structure.

7. The cross-scale structure feature surface machining method based on a multi-component collaborative vibration according to claim 6, wherein when a vibration is applied to a three-axis movement platform, the three-axis movement platform drives the workpiece to vibrate together, and a position equation during the vibration of the workpiece satisfies:

$$z = B_3 \cos(2\pi f_3 t + \varphi_3);$$

$B_3$ is the amplitude of the workpiece in the z-axis direction, and $\varphi_3$ is a phase angle when a contour that needs to be machined is represented by a cosine function; during cutting machining, the movement trajectory of the vibrating tool relative to the workpiece satisfies:

$$x = vt;$$

$$z = B_3 \cos(2\pi f_3 t + \varphi_3);$$

the movement trajectory parameters ($B_3$, v, $f_3$) satisfy:

$$v = d_3 * f_3;$$

$$B_3 = \frac{h_3}{2};$$

wherein $d_3$ is a spacing between millimeter-scale structures, and $h_3$ is a height of a millimeter-scale structure.

8. The cross-scale structure feature surface machining method based on a multi-component collaborative vibration according to claim 7, wherein before cutting machining, for a required cross-scale structure feature surface, the components of a spatial frequency spectrum of the required cross-scale structure feature surface are described through Fourier transform, and the movement trajectory parameters (A, $B_1$, $\varphi_1$, v), ($B_2$, v, $f_2$) and/or ($B_3$, v, $f_3$) of the cutting machining are obtained according to the obtained components of the spatial frequency spectrum, and then the workpiece is cut and machined.

9. The cross-scale structure feature surface machining method based on a multi-component collaborative vibration according to claim 8, wherein the components of the spatial frequency spectrum are obtained through the following steps:

S100, for a given cross-scale structure feature surface $z = f(x, y)$, taking M points from an x-axis, making M first straight lines perpendicular to the x-axis passing through the M points, taking N points in the y-axis direction, making N second straight lines perpendicular to the y-axis passing through the N points, extracting intersection points of the first straight lines and the second straight lines, so as to obtain M*N discrete points, points $Z_{i,j} = f(x_i, y_j)$, $1 \leq i \leq M$, $1 \leq j \leq N$, and obtain a discrete point data matrix $[Z]_{N*M}$;

S200, performing Fourier transform on the discrete point data matrix $[Z]_{N*M}$, so as to obtain a frequency spectrum matrix $[K]_{N*M}$ and a corresponding spectrogram, wherein the frequency spectrum matrix $[K]_{N*M}$ and the corresponding spectrogram comprise the frequency spectrum information of a plurality of groups of component plane waves in different directions that form a curved surface, and the frequency spectrum information comprises an amplitude value, a frequency, a phase angle, and a direction of each group of plane waves;

S300, comparing the amplitude value square sums of the frequency spectrum groups in each direction according to the frequency spectrum matrix and the corresponding frequency spectrum information, taking the direction pointed by the frequency spectrum group with the maximum amplitude value square sum as a machining direction x, and the direction perpendicular to the machining direction x as a feeding direction y;

S400, selecting a y-directional feeding spacing w according to the required machining precision, and dividing the cross-scale structure feature surface according to the spacing w in the direction y to divide the cross-scale structure feature surface into L units, performing frequency spectrum analysis on each unit, extracting the frequency spectrum information of each unit in x-axis direction to obtain the components of the spatial frequency spectrum of the cross-scale structure feature surface, wherein the obtained spatial frequency spectrum of the cross-scale structure feature surface comprises spatial frequency spectrum 1-spatial frequency spectrum L, and the frequency spectrum parameters of each group of spatial frequency spectrum comprise a spatial frequency, an amplitude value, a phase angle, and a direction; and calculating to obtain a height, a cycle, and a distance of each cosine contour forming the cross-scale structure feature surface by using the frequency spectrum parameters.

10. The cross-scale structure feature surface machining method based on multi-component collaborative vibration according to claim 8, wherein when the cross-scale structure comprises a nanometer-scale structure, the movement trajectory parameters of the cutting machining are obtained by the following steps:

S510, selecting a frequency $f_1$ of an elliptic vibration, and determining the movement trajectory parameters (A, $B_1$, $\varphi_1$, v) according to $d_1$, $h_1$, and a determined in S400;

S520, determining the movement trajectory parameters ($B_2$, v, $f_2$) according to v determined in S510 and the spacing $d_2$ and the height $h_2$ of the micron-scale structure, wherein when a cross-scale structure does not comprise a micron-scale structure, $f_2=0$, $B_2=0$;

S530, determining the movement trajectory parameters ($B_3$, v, $f_3$) according to v determined in S510 and the spacing $d_3$ and the height $h_3$ of the millimeter-scale structure, wherein when a cross-scale structure does not comprise a micron-scale structure, $f_3=0$, $B_3=0$;

and when the cross-scale structure comprises a micron-scale structure and millimeter-scale structure, the movement trajectory parameters of the cutting machining are obtained by the following steps:

S610, selecting a vibration frequency $f_2$ of a servo movement mechanism, and determining the movement trajectory parameters ($B_2$, v, $f_2$) according to the spacing $d_2$ and the height $h_2$ of the micron-scale structures; and S620, determining the movement trajectory parameters ($B_3$, v, $f_3$) according to v determined in S610 and the spacing $d_3$ and the height $h_3$ of the millimeter-scale structures.

11. The cross-scale structure feature surface machining method based on a multi-component collaborative vibration according to claim 10, wherein the components of each group of spatial frequency spectrum correspond to each group of process parameters S; each group of process parameters S comprises a group of movement trajectory parameters (A, $B_1$, $\varphi_1$, v) ($B_2$, v, $f_2$) and/or ($B_3$, v, $f_3$); and the spatial frequency spectrum 1-spatial frequency spectrum L corresponds to the process parameters $S_1$, $S_2$, $S_3$ ... $S_l$.

12. The cross-scale structure feature surface machining method based on a multi-component collaborative vibration according to claim 11, during cutting and machining the surface of the workpiece, comprising the following steps:

S710, inputting the process parameters $S_1, S_2, S_3 \ldots S_l$ and the y-directional feeding spacing w into a cutting process system;

S720, enabling the cutting process system to perform collaborative movement according to the process parameter $S_1$ and to return the workpiece to an initial position after forming a first section of structure on the surface of the workpiece;

S730, feeding the vibrating tool for a certain distance w in the y-axis direction;

S730, enabling the cutting process system to perform the collaborative movement according to the process parameter $S_2$ and to return the workpiece to an initial position after forming a second section of structure on the surface of the workpiece;

S740, feeding the vibrating tool for a certain distance w in the y-axis direction;

wherein, the vibrating tool is fed for a certain distance w in the y-axis direction after a section of structure is formed on the surface of the workpiece by performing the collaborative vibration according to a group of process parameter S each time, until the required cross-scale structure is formed according to L groups of process parameters.

13. The cross-scale structure feature surface machining method based on a multi-component collaborative vibration according to claim 11, wherein after the process parameters $S_1, S_2, S_3 \ldots S_l$ are obtained, the quality of a blank of the workpiece is obtained, and the workpiece is precut as required.

14. The cross-scale structure feature surface machining method based on a multi-component collaborative vibration according to claim 1, wherein the vibrating tool is a diamond tool, and the cutting edge radius of the vibrating tool ranges from 50 nm to 200 nm.

* * * * *